(12) United States Patent
Ahn

(10) Patent No.: US 10,891,006 B2
(45) Date of Patent: Jan. 12, 2021

(54) PANEL DRIVING DEVICE AND PANEL DRIVING METHOD

(71) Applicant: SILICON WORKS CO., LTD., Daejeon (KR)

(72) Inventor: Yong Sung Ahn, Seongnam-si (KR)

(73) Assignee: SILICON WORKS CO., LTD., Daejeon (KR)

( * ) Notice: Subject to any disclaimer, the term of this patent is extended or adjusted under 35 U.S.C. 154(b) by 174 days.

(21) Appl. No.: 15/751,793

(22) PCT Filed: Aug. 23, 2016

(86) PCT No.: PCT/KR2016/009285
§ 371 (c)(1),
(2) Date: Feb. 9, 2018

(87) PCT Pub. No.: WO2017/034289
PCT Pub. Date: Mar. 2, 2017

(65) Prior Publication Data
US 2018/0239459 A1    Aug. 23, 2018

(30) Foreign Application Priority Data
Aug. 26, 2015    (KR) .......................... 10-2015-0120201

(51) Int. Cl.
*G06F 3/044* (2006.01)
*G06F 3/041* (2006.01)
*G01R 27/26* (2006.01)

(52) U.S. Cl.
CPC .......... *G06F 3/044* (2013.01); *G01R 27/2605* (2013.01); *G06F 3/0412* (2013.01); *G06F 3/0418* (2013.01); *G06F 2203/04107* (2013.01)

(58) Field of Classification Search
CPC ...... G06F 3/044; G06F 3/0412; G06F 3/0418; G01R 27/2605
See application file for complete search history.

(56) References Cited

U.S. PATENT DOCUMENTS 8,860,685 B2    10/2014  Takeuchi et al.
9,098,161 B2     8/2015  Shin et al.
(Continued)

FOREIGN PATENT DOCUMENTS

CN    203930275 U    11/2014
CN    104731426 A     6/2015
(Continued)

OTHER PUBLICATIONS

PCT International Search Report, PCT/KR2016/009285, dated Nov. 23, 2016, 7 pages.
(Continued)

*Primary Examiner* — Amr A Awad
*Assistant Examiner* — Maheen I Javed
(74) *Attorney, Agent, or Firm* — Fenwick & West LLP

(57) ABSTRACT

The present invention provides a panel driving device: supplying a first signal to a first sensor electrode by using a first amplifier, so as to detect a change in the capacitance of the first sensor electrode; supplying a second signal, having the same waveform as that of the first signal, to a second sensor electrode adjacent to the first sensor electrode by using a second amplifier; and detecting the proximity or a touch of an external object toward the sensor electrodes according to the change in the capacitance of the first sensor electrode.

17 Claims, 23 Drawing Sheets

(56) References Cited

U.S. PATENT DOCUMENTS

| | | | |
|---|---|---|---|
| 9,244,561 B2 | 1/2016 | Hotelling et al. | |
| 9,244,580 B2 | 1/2016 | Hung et al. | |
| 9,293,078 B2 | 3/2016 | Shin et al. | |
| 9,377,915 B2 | 6/2016 | Park et al. | |
| 9,430,963 B2 | 8/2016 | Shin et al. | |
| 2011/0298746 A1 | 12/2011 | Hotelling | |
| 2014/0225850 A1 | 8/2014 | Hristov et al. | |
| 2015/0002466 A1 | 1/2015 | Takeuchi et al. | |
| 2015/0035787 A1* | 2/2015 | Shahparnia | G06F 3/044 345/174 |
| 2015/0091849 A1* | 4/2015 | Ludden | G06F 3/0412 345/174 |
| 2015/0193082 A1 | 7/2015 | Ludden | |
| 2015/0261377 A1* | 9/2015 | Reynolds | G06F 3/0416 345/174 |
| 2016/0349891 A1* | 12/2016 | Kim | G06F 3/0412 |
| 2017/0315646 A1* | 11/2017 | Roziere | G02F 1/13338 |

FOREIGN PATENT DOCUMENTS

| | | |
|---|---|---|
| KR | 10-2011-0087758 A | 8/2011 |
| KR | 10-2013-0044378 A | 5/2013 |
| KR | 10-2015-0055569 A | 5/2015 |
| KR | 10-2015-0073042 A | 6/2015 |

OTHER PUBLICATIONS

China National Intellectual Property Administration, Office Action, CN Patent Application No. 201680048930.1, dated Jun. 2, 2020, 18 pages.

* cited by examiner

PANEL DRIVING DEVICE AND PANEL DRIVING METHOD

TECHNICAL FIELD

The present disclosure relates to a device for driving a panel. In detail, the present disclosure relates to a device for driving a panel including a plurality of sensors that can sense the approach or touch of an object.

BACKGROUND ART

A panel may include a plurality of sensor electrodes to sense the approach or touch of an object.

The sensor electrodes in the panel are driven by a panel driving device.

The panel driving device measures capacitance that is generated between the sensor electrodes and an object by driving the sensor electrodes, thereby sensing the approach or touch of the object.

Meanwhile, not only is capacitance generated between the sensor electrodes and the object, parasitic capacitance is also generated between the sensor electrodes, which causes a problem.

When the parasitic capacitance is increased, the capacitance between the sensor electrodes and the object is relatively decreased, so the touch sensitivity of the panel driving device may be decreased.

When a driving current or driving power is increased to increase the touch sensitivity, power consumption by the panel driving device may be increased and the size of the panel driving device may also be increased.

DETAILED DESCRIPTION OF THE INVENTION

Technical Problem

The present disclosure has been made, in an aspect, to provide a technology for increasing touch sensitivity by decreasing parasitic capacitance generated between sensor electrodes.

In another aspect, the present disclosure provides technology for minimizing power consumption for touch driving.

An aspect of the present disclosure provides a device for driving a panel including a plurality of sensor electrodes.

The device for driving a panel includes a first circuit, a second circuit, a third circuit, and a sensing circuit.

The first circuit may supply a first signal to a first sensor electrode, using a first amplifier that is driven by first-level and second-level voltages.

The second circuit may supply a second signal synchronized in size and phase with the first signal to a second sensor electrode adjacent to the first sensor electrode, using a second amplifier configured to be driven by the first-level and second-level voltages.

The third circuit may supply a third signal fluctuating to the first level and the second level and synchronized in phase with the first signal to a third sensor electrode.

The sensing circuit may sense an external object approaching or touching the panel on the basis of a change in the capacitance of the first sensor electrode.

Another aspect of the present disclosure provides a method of driving a panel including a plurality of sensor electrodes.

The method of driving a panel includes supplying a first signal having a first waveform to a first sensor electrode, using a first amplifier configured to be driven by first-level and second-level supply voltages.

The method of driving a panel includes supplying a second signal having substantially the same waveform as the first waveform to a second sensor electrode adjacent to the first sensor electrode, using a second amplifier configured to be driven by the first-level and second-level supply voltages.

The method of driving a panel includes supplying a third signal fluctuating to the first level and a third level and synchronized in phase with the first signal to a third sensor electrode.

The method of driving a panel includes sensing an external object approaching or touching the panel on the basis of a change in the capacitance of the first sensor electrode.

Another aspect of the present disclosure provides a device for driving a panel including a plurality of pixels, a plurality of data lines transmitting a data voltage to the pixels, and a plurality of sensor electrodes respectively overlapping a plurality of data line groups.

The panel driving device includes a first circuit, a second circuit, and a sensing circuit.

The first circuit may supply a first signal to the first sensor electrode.

The second circuit may supply a second signal synchronized in phase with the first signal to a plurality of data line groups overlapping the first sensor group, and supply a second signal to at least one of a plurality of data line groups overlapping a second sensor electrode adjacent to the first sensor electrode.

The sensing circuit may sense an external object approaching or touching the panel on the basis of a change in the capacitance of the first sensor electrode.

According to the present disclosure, parasitic capacitance that is generated between sensor electrodes or parasitic capacitance that is generated between a sensor electrode is observed to be small or not detectable. Further, according to the present disclosure, touch sensitivity is increased and power consumption for touch driving is reduced.

MODE FOR CARRYING OUT THE INVENTION

Figure 1:
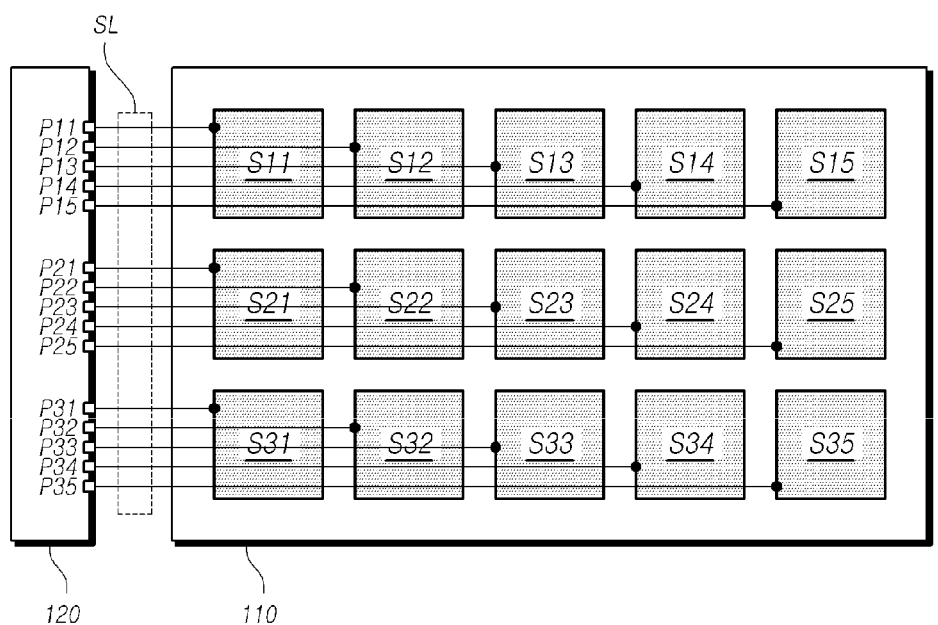
FIG. 1 is a diagram schematically showing the configuration of a display device according to an embodiment.

Hereinafter, embodiments are described in detail with reference to exemplary drawings. When components are given reference numerals in the drawings, the same components are given the same reference numerals even if they are shown in different drawings. Further, in describing the present disclosure, well-known functions or constructions will not be described in detail if they may unnecessarily obscure the understanding of the present disclosure.

Further, terms 'first', 'second', 'A', 'B', '(a)', and '(b)' can be used in the following description of embodiments. The terms are provided only for discriminating components from other components and, the essence, sequence, or order of the components are not limited by the terms. When a component is described as being "connected", "combined", or "coupled" with another component, it should be understood that the component may be connected or coupled to another component directly or with another component interposing therebetween.

FIG. 1 is a diagram schematically showing the configuration of a display device according to an embodiment.

Referring to FIG. 1, a display device 100 may include a panel 110 and a panel driving device 120.

The panel 110 may include a display panel and a Touch Screen Panel (TSP), in which the display panel and the touch screen panel may share some components. For example, a plurality of sensor electrodes S11~S15, S21~S25, and S31~S35 may be components (for example, common electrodes to which a common voltage is applied) of a display panel and may also be components (sensor electrodes for sensing a touch) of a touch panel. Since some of the components of the display panel and the touch screen panel are shared, the panel 110 is also called an integrated panel, but the present disclosure is not limited thereto. Further, an in-cell type panel in which a display panel and a touch screen panel share some components is known, but this is only an embodiment of the panel 110 and the panels to which the present disclosure may be applied are not limited to such an in-cell type panel.

A plurality of pixels may be disposed on the panel 110. The panel driving device 120 can display images on the panel 110 by driving the pixels. A pixel electrode may be disposed in each of the pixels and the panel driving device 120 can display images on the panel 110 by supplying a data voltage to the pixel electrodes.

In detail, the panel driving device 120 can display images on the panel 110 by selecting specific pixels or pixels disposed in a specific line and supplying a data voltage to the selected pixels. To this end, the panel driving device 120 may include a gate driving circuit and a data driving circuit.

The data driving circuit supplies a voltage to a data line to display a digital image on the pixels of the panel 110.

The data driving circuit may include at least one data driver integrated circuit and the at least one data driver circuit may be connected to a bonding pad of the panel 110 in a Tape-Automated-Bonding (TAB) manner or a Chip-On-Glass (COG) manner or may be formed directly in the panel 110, and in some cases, it may be integrated in the panel 110. Further, the data driving circuit may be implemented in a Chip-On-Film (COF) manner.

The gate driving circuit sequentially supplies scan signals to a gate line to select specific pixels by turning on or off transistors in the pixels.

The gate driving circuit, depending on the driving manner, may be disposed on only one side of the panel 110, or two separate gate driving circuits may be respectively disposed on both sides of the panel 110.

Further, gate driving circuit may be implemented in at least one gate driver integrated circuit, which may be connected to a bonding pad of the panel 110 in the TAB manner or the COG manner or may be implemented in a Gate In Panel (GIP) manner directly on the panel 110, or, in some cases, may be integrated in the panel 110. Further, the gate driving circuit 130 may be implemented in the COF manner.

The panel 110 may include a plurality of sensor electrodes S11~S15, S21~S25, and S31~S35. The sensor electrodes S11~S15, S21~S25, and S31~S35 may be spaced from each other. Further, at least one pixel may be disposed in the area where the sensor electrodes S11~S15, S21~S25, and S31~S35 are disposed.

The panel driving device 120 can sense an external object approaching or touching the panel 110 by driving the sensor electrodes S11~S15, S21~S25, and S31~S35. The panel driving device 120 may drive all or only some of the sensor electrodes S11~S15, S21~S25, and S31~S35.

The panel driving device 120 can drive the sensor electrodes S11~S15, S21~S25, and S31~S35, using a sensor driving circuit that is a separate integrated circuit from the data driving circuit and the gate driving circuit. As another example, in the panel driving device 120, the data driving circuit and the sensor driving circuit may constitute one integrated circuit, and the gate driving circuit may constitute another one integrated circuit. As another example, in the panel driving device 120, the gate driving circuit and the sensor driving circuit may constitute one integrated circuit, and the data driving circuit may constitute another one integrated circuit. Further, the data driving circuit, the gate driving circuit, and the sensor driving circuit may share some components.

The panel driving device 120 may employ a capacitive touch manner that senses the approach or touch of an object by sensing a change in the capacitance of the sensor electrodes S11~S15, S21~S25, and S31~S35.

The capacitive touch manner can be divided into a mutual-capacitive touch manner and a self-capacitive touch manner.

The mutual-capacitive touch manner that is a kind of capacitive touch manner applies a sensor driving signal to a sensor electrode (Tx electrode) and senses another sensor electrode (Rx electrode) coupled to the Tx electrode. In the mutual-capacitive touch manner, different values are sensed at the Rx electrode, depending on the approach or touch of an object such as a finger or a pen, so the mutual-capacitive touch manner detects whether there is a touch, the touch coordinates, etc., using the sensing values at the Rx electrode.

The self-capacitive touch manner that is another kind of capacitive touch manner applies a sensor driving signal to a sensor electrode and then senses the sensor electrode. In the self-capacitive touch manner, different values are sensed at the sensor electrode, depending on the approach or touch of an object such as a finger or a pen, so the self-capacitive touch manner detects whether there is a touch, the touch coordinates, etc., using the sensing values. In the self-capacitive touch manner, the sensor electrode to which a sensor driving signal is applied and the sensor electrode for sensing are the same, so there is no discrimination of a Tx electrode and an Rx electrode.

The panel driving device 120 can employ one of the two capacitive touch manners (the mutual-capacitive touch manner and the self-capacitive touch manner). In the present disclosure, by way of example, the self-capacitive touch manner is employed in embodiments for the convenience of description.

In an example of the self-capacitive touch manner, the sensor electrodes S11~S15, S21~S25, and S31~S35 are connected to the panel driving device 120 through sensing lines SL and the sensing lines SL may be connected one to one to the sensor electrodes S11~S15, S21~S25, and S31~S35. Output pins P11-P15, P21-P25, and P31~P35, which are connected to the sensing lines SL, of the panel driving device, are given numbers for the convenience of description, but the output pins P11~P15, P21~P25, and P31~P35 of the panel driving device 120 may not be connected one to one to the sensing lines SL, as shown in FIG. 1. For example, a MUX may be disposed outside the panel driving device 120 and the panel driving device 120 may be connected to the sensing lines SL through the MUX. In this case, the output pins of the panel driving device 120 may be smaller in number than the sensing lines SL.

Figure 2:
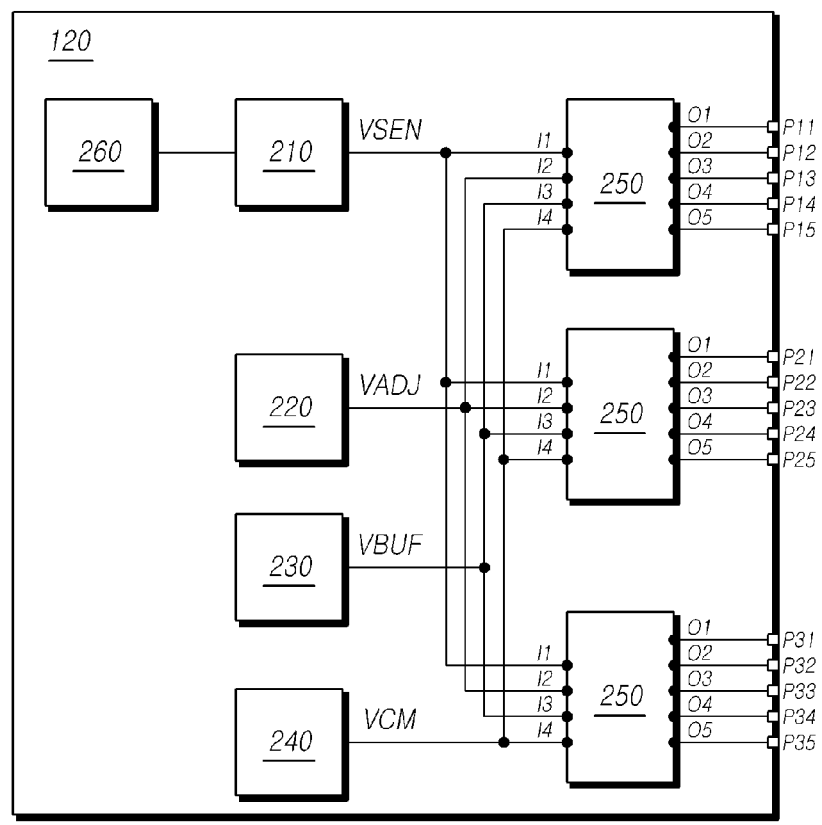
FIG. 2 is a diagram schematically showing an exemplary configuration of the panel driving device shown in FIG. 1.

FIG. 2 is a diagram schematically showing an exemplary configuration of the panel driving device according to an embodiment.

Referring to FIG. 2, the panel driving device 120 may include a first circuit 210 that outputs a first signal VSEN, a second signal 220 that outputs a second signal VADJ, a third circuit 230 that outputs a third signal VBUF, and a fourth circuit 240 that outputs a common voltage VCM. Further, the panel driving device 120 may include: a switching circuit 250 that selects and transmits one of the first signal VSEN, second signal VADJ, third signal VBUF, and common voltage VCM to the output pins P11~P15, P21~P25, and P31~P35; and a sensing circuit 260 that senses the approach or touch of an object on the basis of a sensing value of the first circuit 210. For the convenience of description, numbers are assigned to first-side pins I1~I4 and second-side pins O1_O5 of the switching circuit 250.

Referring to FIGS. 1 and 2, the first circuit 210 can supply a first signal VSEN to the sensor electrodes S11~S15, S21~S25, and S31~S35 to sense a change in the capacitance of the sensor electrodes S11~S15, S21~S25, and S31~S35. The first signal VSEN is a modulated signal and the first circuit 210 can sense a change in the capacitance of the sensor electrodes S11~S15, S21~S25, and S31~S35 by demodulating response signals of the sensor electrodes S11~S15, S21~S25, and S31~S35 to the supply of the modulated signal.

The second circuit 220 can supply the second signal VADJ to the sensor electrodes S11~S15, S21~S25, and S31~S35 such that the capacitance that is generated between the sensor electrodes S11~S15, S21~S25, and S31~S35 is not sensed by the first circuit 210.

The third circuit 230 can supply the third signal VBUF to the sensor electrodes S11~S15, S21~S25, and S31~S35, whereby it is possible to reduce the influence on the first circuit 210 by the capacitance that is generated between the sensor electrodes S11~S15, S21~S25, and S31~S35.

The first signal VSEN is also referred to as a driving signal, and the second signal VADJ and the third signals VBUF are also referred to as load-free signals, but the first signal VSEN, second signal VADJ, and third signal VBUF are not limited to the names.

Meanwhile, the sensor electrodes S11~S15, S21~S25, and S31~S35 may function as common electrodes, and the fourth circuit 240 can supply the common voltage VCM to the sensor electrodes S11~S15, S21~S25, and S31~S35 when the sensor electrodes S11~S15, S21~S25, and S31~S35 function as common electrodes.

The sensor electrodes S11~S15, S21~S25, and S31~S35 can receive different signals in different separate time periods, respectively. For example, the sensor electrode S11 can receive the first signal VSEN in a first time period and can receive the common voltage VCM in a second time period not overlapping the first time period. In a specific embodiment, the first time period is also referred to as a touch sensing period and the second time period is also referred to as a display period, but the present disclosure is not limited to the embodiment. For example, the sensor electrode S11 may receive the first signal VSEN in the first time period and the common voltage VCM in the second time period and the sensor electrode S21 may receive the common voltage VCM in the first time period and the first signal VSEN in the second time period.

The switching circuit 250 can select and transmit one of the first signal VSEN, second signal VADJ, third signal VBUF, and common voltage VCM to the output pins P11~P15, P21~P25, and P31~P35.

The first circuit 210, second circuit 220, third circuit 230, and fourth circuit 240 may be connected respectively to the first-side pins I1~I4 of the switching circuit 250, and the output pins P11~P15, P21~P25, and P31~P35 may be connected respectively to the second-side pins O1~O5.

The switching circuit 250 can connect the first-side pins I1~I4 and the second side pins O1~O5, using a switching element.

Figure 3:
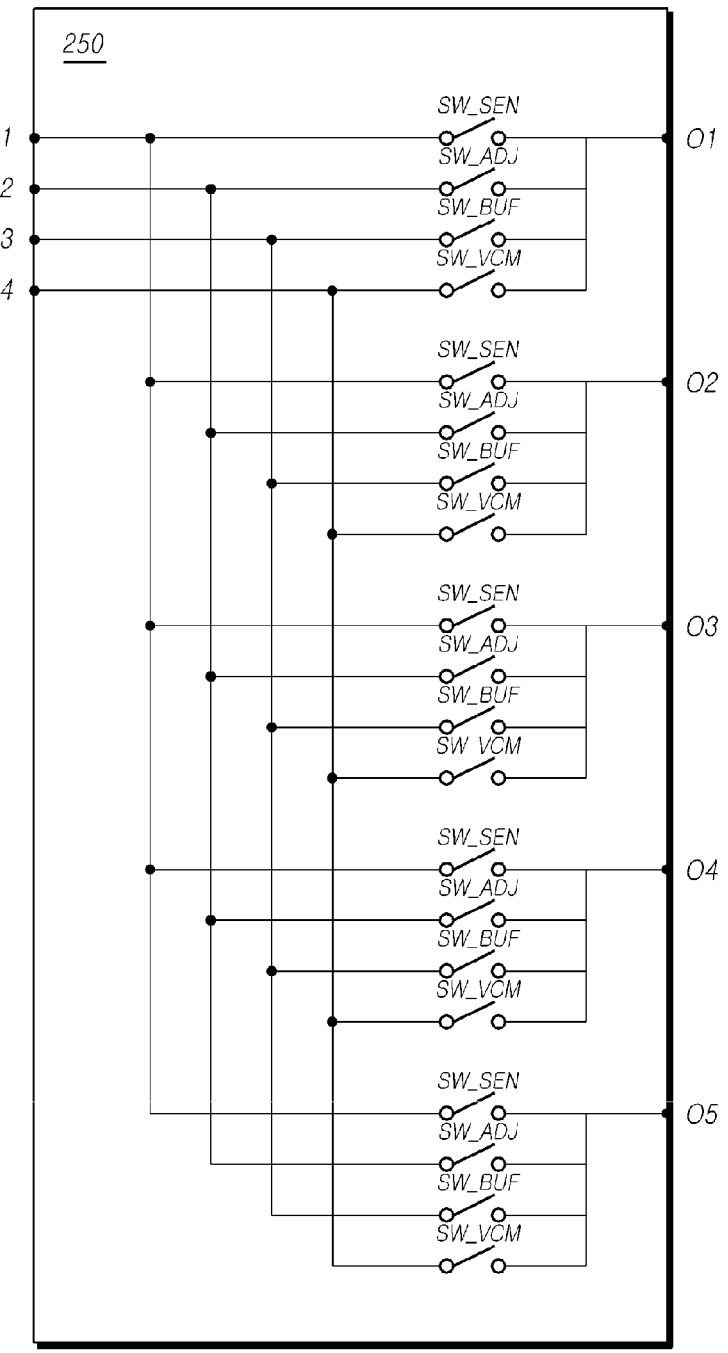
FIG. 3 is a diagram schematically showing the internal configuration of a switching circuit.

FIG. 3 is a diagram schematically showing the internal configuration of the switching circuit according to an embodiment.

Referring to FIG. 3, the switching circuit 250 may include a plurality of first switches SW_SEN, a plurality of second switches SW_ADJ, a plurality of third switches SW_BUF, and a plurality of fourth switches SW_VCM. The numbers of the switches SW_SEN, SW_ADJ, SW_BUF, and SW_VCM may be the same as the number of the second-side pins O1~O5.

The first switches SW_SEN can connect the pin I1 to the second-side pins O1~O5. Referring back to FIGS. 1 and 2, the pins I1 are connected to the first circuit 210 and the second-side pins O1~O5 are connected to the sensor electrodes S11~S15, S21~S25, and S31~S35 through the output pins P11~P15, P21~P25, and P31~P35. Accordingly, the first switches SW_SEN have first ends connected to the first circuit 210 and second ends connected to the sensor electrodes S11~S15, S21~S25, and S31~S35 through the output pins P11~P15, P21~P25, and P31~P35.

When the first switches SW_SEN are closed, the first signal VSEN output from the first circuit 210 is supplied to the sensor electrodes S11~S15, S21~S25, and S31~S35, and when the first switches SW_SEN are opened, the first signal VSEN output from the first circuit 210 is not supplied to the sensor electrodes S11~S15, S21~S25, and S31~S35.

The second switches SW_ADJ can connect the pin I2 to the second-side pins O1~O5. Referring back to FIGS. 1 and 2, the pins I2 are connected to the second circuit 220 and the second-side pins O1~O5 are connected to the sensor electrodes S11~S15, S21~S25, and S31~S35 through the output pins P11~P15, P21~P25, and P31~P35. Accordingly, the second switches SW_ADJ have first ends connected to the second circuit 220 and second ends connected to the sensor electrodes S11~S15, S21~S25, and S31~S35 through the output pins P11~P15, P21~P25, and P31~P35.

When the second switches SW_ADJ are closed, the second signal VADJ output from the second circuit 220 is supplied to the sensor electrodes S11~S15, S21~S25, and S31~S35, and when the second switches SW_ADJ are opened, the second signal VADJ output from the second circuit 220 is not supplied to the sensor electrodes S11~S15, S21~S25, and S31~S35.

The third switches SW_BUF can connect the pin I3 to the second-side pins O1~O5. Referring back to FIGS. 1 and 2, the pins I3 are connected to the third circuit 230 and the second-side pins O1~O5 are connected to the sensor electrodes S11~S15, S21~S25, and S31~S35 through the output pins P11~P15, P21~P25, and P31~P35. Accordingly, the third switches SW_BUF have first ends connected to the third circuit 230 and second ends connected to the sensor electrodes S11~S15, S21~S25, and S31~S35 through the output pins P11~P15, P21~P25, and P31~P35.

When the third switches SW_BUF are closed, the third signal VBUF output from the third circuit 230 is supplied to the sensor electrodes S11~S15, S21~S25, and S31~S35, and when the third switches SW_BUF are opened, the third signal VBUF output from the third circuit 230 is not supplied to the sensor electrodes S11~S15, S21~S25, and S31~S35.

The fourth switches SW_VCM can connect the pin I4 to the second-side pins O1~O5. Referring back to FIGS. 1 and 2, the pins I4 are connected to the fourth circuit 240 and the second-side pins O1~O5 are connected to the sensor electrodes S11~S15, S21~S25, and S31~S35 through the output pins P11~P15, P21~P25, and P31~P35. Accordingly, the fourth switches SW_VCM have first ends connected to the fourth circuit 240 and second ends connected to the sensor electrodes S11~S15, S21~S25, and S31~S35 through the output pins P11~P15, P21~P25, and P31~P35.

When the fourth switches SW_VCM are closed, the fourth signal VCM output from the fourth circuit 240 is supplied to the sensor electrodes S11~S15, S21~S25, and S31~S35, and when the fourth switches SW_VCM are opened, the fourth signal VCM output from the fourth circuit 240 is not supplied to the sensor electrodes S11~S15, S21~S25, and S31~S35.

An embodiment in which a switching circuit selects and outputs one of the first signal VSEN, second signal VADJ, third signal VBUF, and common voltage VCM was described with reference to FIGS. 2 and 3. However, the switch circuit may select and output signals other these signals. For example, the switching circuit may output a constant low voltage (for example, a ground voltage) or a constant high voltage to the sensor electrodes S11~S15, S21~S25, and S31~S35.

On the other hand, the first circuit 210 can generate the first signal VSEN, using an amplifier, and supply the first signal VSEN to the sensor electrodes S11~S15, S21~S25, and S31~S35. The second circuit 220 can generate the second signal VADJ, using an amplifier, and supply the second signal VADJ to the sensor electrodes S11~S15, S21~S25, and S31~S35.

The sensor electrodes S11~S15, S21~S25, and S31~S35 may have high capacitance. When power supplied from a power supply is supplied as it is to the sensor electrodes S11~S15, S21~S25, and S31~S35, a signal with a distorted waveform may be supplied because the driving current is low in comparison to the capacitance of the sensor electrodes S11~S15, S21~S25, and S31~S35. For example, a rising time may be increased or a falling time may be increased.

In order to prevent this problem, the first circuit 210 can generate and supply the first signal VSEN to the sensor electrodes S11~S15, S21~S25, and S31~S35, using an amplifier, and the second circuit 220 can generate and supply the second signal VADJ to the sensor electrodes S11~S15, S21~S25, and S31~S35, using an amplifier. However, if the number of amplifiers that are included in a circuit is increased, the manufacturing cost and size of the circuit may be increased, so the third circuit 230 can generate the third signal VBUF without using the amplifiers used in the first circuit 210 and the second circuit 220.

Figure 4:
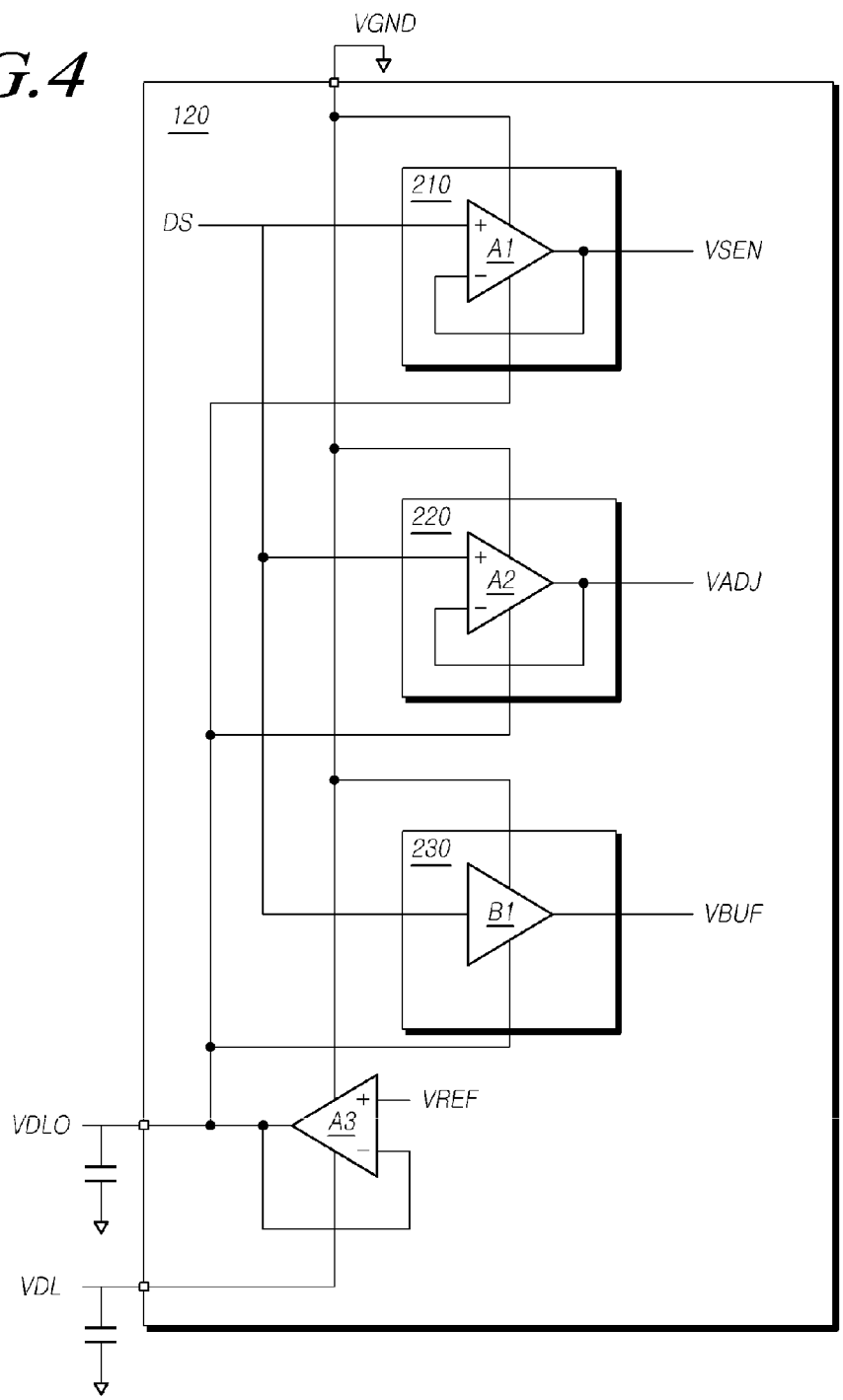
FIG. 4 is a diagram showing signal generation relationships between a first circuit, a second circuit, and a third circuit.
Figure 5:
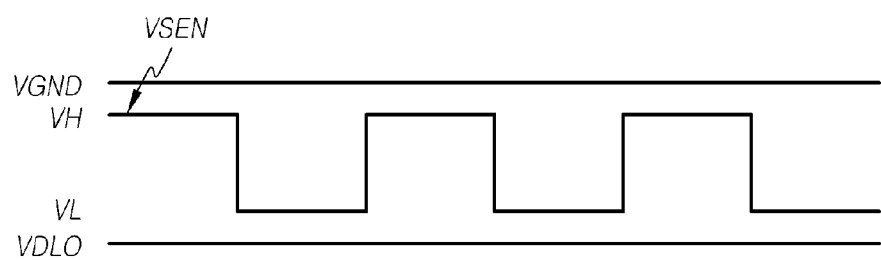
FIG. 5 is a diagram showing the waveforms of a first signal and a supply power.
Figure 6:
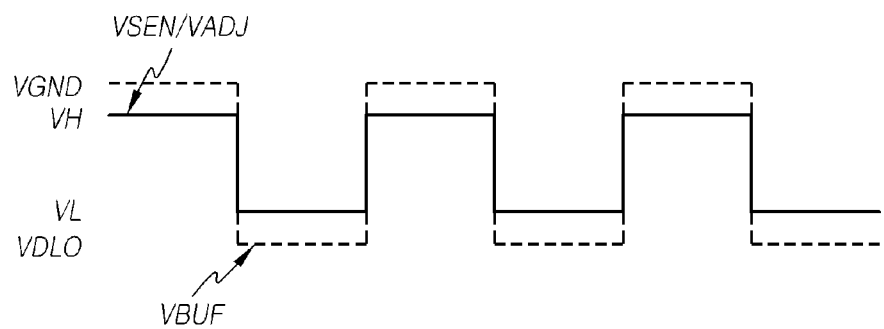
FIG. 6 is a diagram showing the waveforms of a first signal, a second signal, and a third signal.

FIG. 4 is a diagram showing signal generation relationships between the first circuit, second circuit, and third circuit, FIG. 5 is a diagram showing waveforms of the first signal and a supply power, and FIG. 6 is a diagram showing waveforms of the first signal, second signal, and third signal.

Referring to FIG. 4, the first circuit 210 can generate the first signal VSEN, using a first amplifier A1 and the second circuit 220 can generate the second signal VADJ, using a second amplifier A2. The third circuit 230 can generate the third signal VBUF, using a buffer B1.

The panel driving device 120 can receive a first power voltage VDL from the outside and use it to drive the internal elements.

The panel driving device 120 can process the first power voltage VDL into a second power voltage VDLO, using a third amplifier A3, and can drive the internal elements, using the second power voltage VDLO.

The magnitude of the second power voltage VDLO output from the third amplifier A3 can be controlled in accordance with the magnitude of a reference voltage VREF input to a first input terminal (+) of the third amplifier A3.

However, since the third amplifier A3 receives the first power voltage VDL and a ground voltage VGND as supply voltages and is driven by the voltages, the magnitude of the second power voltage VDLO output from the third amplifier A3 may be between the ground voltage VGND and the first power voltage VDL.

The first amplifier A1 included in the first circuit 210 can receive a first-level voltage and a second-level voltage as supply voltages and can be driven by the voltages. According to the embodiment shown in FIG. 4, the first circuit 210 receives the ground voltage VGND and the second power voltage VDLO as first-level and second-level supply voltages and is driven by the voltages.

The first signal VSEN output from the first circuit 210 is a modulated signal and may have a specific waveform. The specific waveform may depend on the waveform of the driving signal DS that is input to the first input terminal (+) of the first amplifier A1.

Referring to FIG. 5, the first signal VSEN may be a square wave fluctuating between a third level VH and a fourth level VL.

The first amplifier A1 that generates the first signal VSEN is driven by the first-level voltage and the second-level voltage, so the fluctuation range of the first signal VSEN may be between the first level and the second level.

As a detailed example, the first level may be the ground voltage VGND and the second level may be the second power voltage VDLO, and in this embodiment, the fluctuation range of the first signal VSEN may be between the ground voltage VGND and the second power voltage VDLO.

When the first signal VSEN has a square wave fluctuating to the third level VH and the fourth level VL, the third level VH and the fourth level VL may be levels between the first level and the second level. As a detailed example, the first level may be the ground voltage VGND and the second level may be the second power voltage VDLO, and in this embodiment, the third level VH and the fourth level VL may be levels between the ground voltage VGND and the second power voltage VDLO.

The second amplifier A2 included in the second circuit 220 can receive a fifth-level voltage and a sixth-level voltage as supply voltages and can be driven by the voltages. According to the embodiment shown in FIG. 4, the second circuit 220 receives the ground voltage VGND and the second power voltage VDLO as fifth-level and sixth-level supply voltages and is driven by the voltages.

The second signal VADJ output from the second circuit 220 may have substantially the same waveform as the waveform of the first signal VSEN. The same driving signal DS may be input to first input terminals (+) of the first amplifier A1 and the second amplifier A2, so the waveforms of the second signal VADJ and the first signal VSEN may be substantially the same due to the same driving signal DS.

Referring to FIG. 6, the second signal VADJ may be a square wave substantially having the same waveform as the first signal VSEN and fluctuating between the third level VH and the fourth level VL.

The second signal VADJ may have a square wave fluctuating to a seventh level and an eighth level, and the seventh level and the eighth level may be substantially the same as the third level VH and the fourth level VL. The expression 'substantially the same' may vary in meaning, but such variation is small enough to be technically negligible.

On the other hand, since the second amplifier A2 that generates the second signal VADJ is driven by a fifth-level voltage and a sixth-level voltage, and the fluctuation range of the second signal VADJ may be between the fifth level and the sixth level.

As a detailed example, the fifth level may be the ground voltage VGND and the sixth level may be the second power voltage VDLO, and in this embodiment, the fluctuation range of the second signal VADJ may be between the ground voltage VGND and the second power voltage VDLO.

As in the embodiment shown in FIG. 4, when the first amplifier A1 of the first circuit 210 and the second amplifier A2 of the second circuit 220 are driven by the same voltage, the fluctuation ranges of the first signal VSEN generated by the first amplifier A1 and the second signal VADJ generated by the second amplifier A2 may be the same.

The third circuit 230 can generate the third signal VBUF fluctuating to the first level and the second level, using or without using the buffer B1.

For example, when the third circuit 230 includes the buffer B1, first-level and second-level supply voltages can be supplied to the buffer B1 and an input signal that can select one of the first-level and second-level supply voltages can be input to an input terminal.

In detail, in the embodiment shown in FIG. 4, the ground voltage VGND and the second power voltage VDLO are input as supply voltages to the buffer B1 and the driving signal DS is input to the input terminal. In this case, the buffer B1 can select one of the ground voltage VGND and the second power voltage VDLO and output the selected voltage as the third signal VBUF, depending on the value of the driving signal DS.

Meanwhile, unlike the embodiment shown in FIG. 4, the ground voltage VGND and the first power voltage VDL may be input as supply voltages to the buffer B1 and the driving signal DS may be input to the input terminal. In this case, the buffer B1 can select one of the ground voltage VGND and the first power voltage VDL and output the selected voltage as the third signal VBUF, depending on the value of the driving signal DS.

Meanwhile, the third circuit 230 may select one of the first-level and second-level voltages and generate the third signal VBUF without the buffer B1. For example, the third circuit 230 may further include a switch (not shown) having two inputs and one output. As the two inputs, the first-level and second-level voltages may be input. The third circuit 230 can receive the driving signal DS and send out one of the first-level and second-level voltages as the output by controlling the switch (not shown) in response to the driving signal DS.

Referring to FIG. 6, the waveform of the third signal VBUF may be similar to the waveform of the first signal VSEN, but the sizes of the waveforms may be different. The third signal VBUF and the first signal VSEN may be the same in phase.

In detail, the waveform of the third signal VBUF fluctuates to the first level (for example, VGND) and the second level (for example, VDLO), but the waveform of the first signal VSEN fluctuates to the third level VH and the fourth level VL between the first level (for example, VGND) and the second level (for example, VDLO).

Since the first circuit 210 and the second circuit 220 generate signals VSEN and VADJ, using the amplifiers A1 and A2 of which the supply voltages are the first level (for example, VGND) and the second level (for example, VDLO), the fluctuation ranges of these signals VSEN and VADJ may be smaller than the range of the supply voltages (the range between the first level and the second level).

Since the second circuit 220 includes the second amplifier A2, it can output a waveform substantially the same as that of the first circuit 210, but since the amplifier should be included as an internal circuit, the circuit area may be larger than that of the third circuit 230. However, since the third circuit 230 generates the third signal VBUF, using the first-level voltage and the second-level voltages as they are without using an amplifier, it cannot output the same waveform as that of the first circuit 210, but since it does not include an amplifier as an internal circuit, the circuit area may be smaller than the second circuit 220.

In order to minimize the circuit area and influence of capacitance that is generated between the sensor electrodes S11~S15, S21~S25, and S31~S35, a second electrode adjacent to a first sensor electrode to which the first signal VSEN is supplied may be driven by the second circuit 220 and a third sensor electrode not adjacent to the first sensor electrode can be driven by the third circuit 230.

Figure 7:
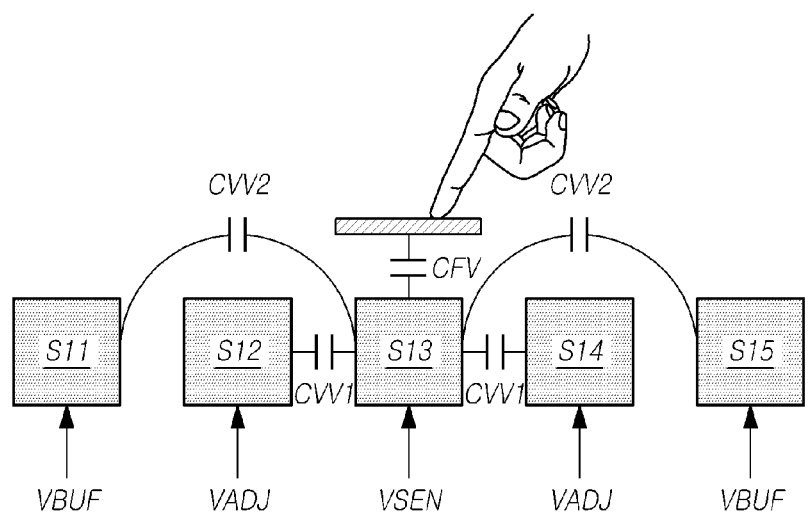
FIG. 7 is a diagram schematically showing the capacitance generated between sensor electrodes.

FIG. 7 is a diagram schematically showing capacitance generated between sensor electrodes.

Referring to FIG. 7, the panel driving device 120 can sense a change in the capacitance of the sensor electrode S13 by supplying the first signal VSEN to the sensor electrode S13.

The panel driving device 120 can supply the second signal VADJ having substantially the same waveform as that of the first signal VSEN to the sensor electrode S12 and the sensor electrode S14 adjacent to the sensor electrode S13. The panel driving device 120 can supply the third signal VBUF to the sensor electrode S11 and the sensor electrode S15 that are not adjacent to the sensor electrode S13, but may generate parasitic capacitance between the same and the sensor electrode S13.

Referring to FIG. 7, first parasitic capacitance CVV1 may be generated between the sensor electrode S13 and the sensor electrode S12. Further, the first parasitic capacitance CVV1 may be generated between the sensor electrode S13 and the sensor electrode S14.

Second parasitic capacitance CVV2 may be generated between the sensor electrode S13 and the sensor electrode S11. The second parasitic capacitance CVV2 may also be generated between the sensor electrode S13 and the sensor electrode S15.

The magnitude of capacitance is in proportion to the areas of two electrodes and in inverse proportion to the distance between the two electrodes. According to calculation under this rule, the magnitude of the second parasitic capacitance CVV2 is ¼ of the magnitude of the first parasitic capacitance CVV1. Since the second parasitic capacitance CVV2 is smaller in magnitude than the first parasitic capacitance CVV1, the second parasitic capacitance CVV2 has less influence than the first parasitic capacitance CVV1 on the panel driving device 120 sensing a change in the capacitance of the sensor electrode S13.

The panel driving device 120 supplies a first signal VSEN to the first sensor electrode (the sensor electrode S13 in the embodiment shown in FIG. 7) to be sensed, and supplies a second signal VADJ having a larger magnitude than the first signal VSEN to the second sensor electrodes (the sensor electrode S12 and the sensor electrode S14 in the embodiment of FIG. 7) that are adjacent to the first sensor electrode and generate relatively high parasitic capacitance.

When the same waveform is supplied to two electrodes (for example, the first sensor electrode and the second sensor electrode) that generate parasitic capacitance, voltages at both ends of the parasitic capacitance are not changed, so an effect similar to the absence of parasitic capacitance is obtained.

As described above, when the panel driving device 120 supplies a first signal VSEN to the first sensor electrode (the sensor electrode S13 in the embodiment shown in FIG. 7) to be sensed and supplies a second signal VADJ having the same magnitude as the first signal VSEN to second sensor electrodes (the sensor electrode S12 and sensor electrode S14 in the embodiment shown in FIG. 7) that are adjacent to the first sensor electrode and generate relatively high parasitic capacitance, the parasitic capacitance between the first sensor electrode and the second sensor electrodes appears as through there were no parasitic capacitance between the first sensor electrode and the second sensor electrodes. Further, though not described above, the first signal VSEN, second signal VADJ, and third signal VBUF may have the same phase to minimize the parasitic capacitance effect between sensor electrodes.

In this way, the panel driving device 120 can remove the parasitic capacitance that is generated between two adjacent sensor electrodes. Alternatively, the panel driving device 120 can make the influence by the parasitic capacitance that is generated between two adjacent sensor electrodes negligible.

The panel driving device 120 supplies a first signal VSEN to the first sensor electrode (the sensor electrode S13 in the embodiment shown in FIG. 7) to be sensed, and supplies a third signal VADJ having a waveform having the same phase as the first signal VSEN to the third sensor electrodes (the sensor electrode S11 and sensor electrode S15 in the embodiment of FIG. 7) that are not adjacent to the first sensor electrode, but generate parasitic capacitance together with the first sensor electrode. In this case, the influence on sensing of the sensor electrodes S11~S15, S21~S25, and S31~S35 by the parasitic capacitance generated between the first sensor electrode and the third sensor electrodes can be minimized.

According to this driving method, the first parasitic capacitance CVV1 and the second parasitic capacitance CVV2 that are generated around a sensor electrode (for example, the sensor electrode S13) to be sensed is substantially negligible. Accordingly, the panel driving device 120 can sense the approach or touch of an object by sensing only the change in touch capacitance CFV generated between the sensor electrode S13 and the object.

The panel driving device 120 may operate several sensor electrodes in groups.

Figure 8:
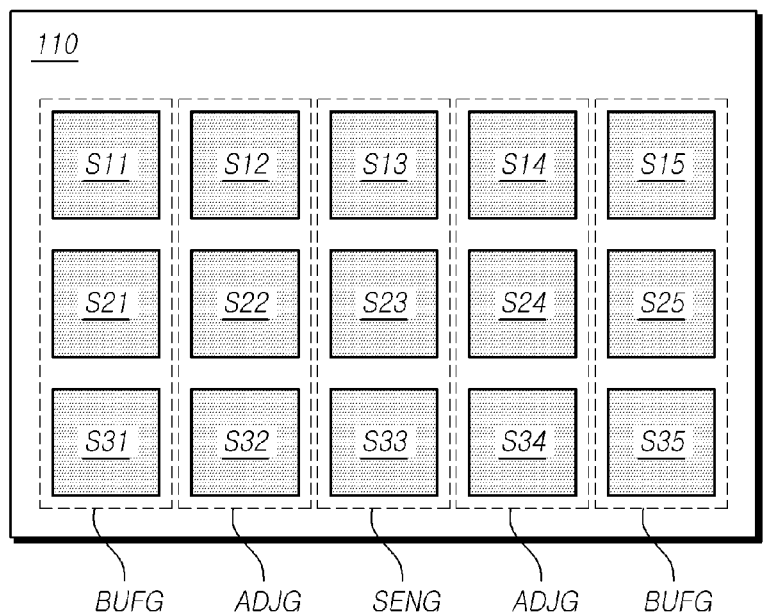
FIG. 8 is a diagram showing sensor electrode groups to which the same signal is supplied.

FIG. 8 is a diagram showing sensor electrode groups to which the same signal is supplied.

Referring to FIG. 8, the panel driving device 120 can drive several sensor electrodes in groups in a first direction (for example, the lengthwise direction).

For example, the first circuit 210 can set the sensor electrodes S12, S23, and S33 in the same column in a sensing group SENG and supply a first signal VSEN to the sensing group SENG.

The second circuit 220 can supply a second signal VADJ to surrounding groups ADJG adjacent to the group of sensor electrodes to which the first signal VSEN is supplied.

The third circuit 230 can supply a third signal VBUF to buff groups BUFG adjacent to the surrounding groups ADJG to which the second signal VADJ is supplied.

The lengthwise grouping shown in FIG. 8 is merely an example, and, depending on the embodiment, transverse grouping may be possible, and grouping in other directions may also be possible.

There are electrodes other than the sensor electrodes S11~S15, S21~S25, and S31~S35 in the panel 110, so the sensor electrodes S11~S15, S21~S25, and S31~S35 may generate parasitic capacitance with these other sensor electrodes.

For example, a plurality of gate lines and a plurality of data lines may be disposed on the panel 110 and the sensor electrodes S11~S15, S21~S25, and S31~S35 can generate parasitic capacitance even with the date lines and data lines.

The panel driving device 120 can supply a waveform having the same phase as a first signal VSEN to the gate lines and data lines to remove the parasitic capacitance.

For example, the panel driving device 120 can remove the parasitic capacitance that is between the sensor electrodes S11~S15, S21~S25, and S31~S35 and the gate lines by supplying a third signal VBUF or another signal having substantially the same waveform as the third signal to the gate lines.

As another example, the panel driving device 120, in detail, the second circuit can remove the parasitic capacitance that is generated between the sensor electrodes S11~S15, S21~S25, and S31~S35 and the data line by supplying a second signal VADJ or another signal having substantially the same waveform as the second signal to the data lines.

Figure 9:
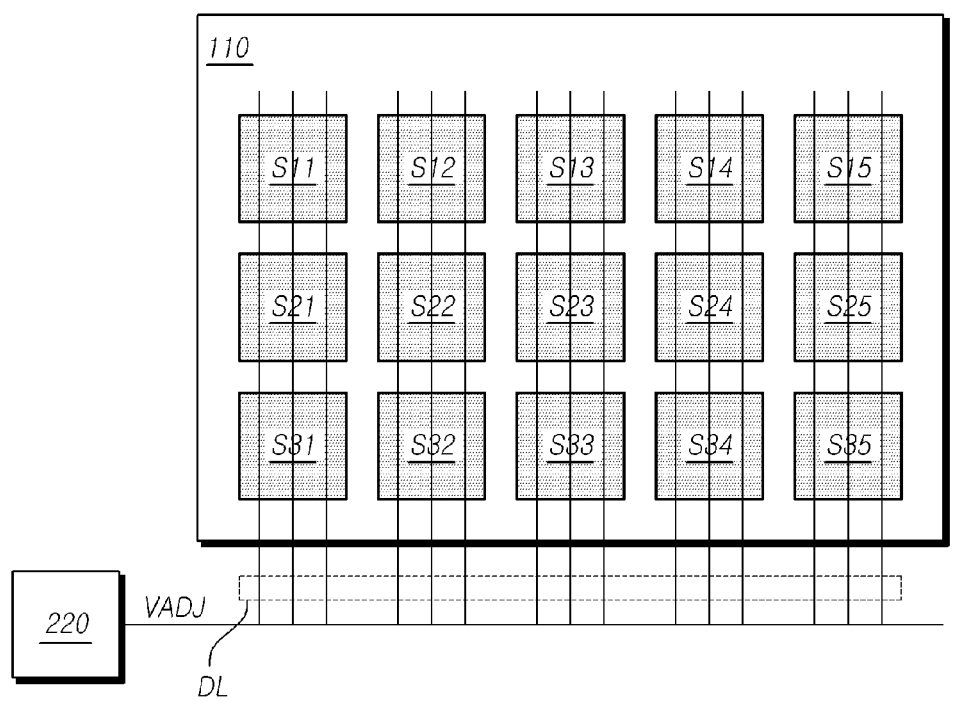
FIG. 9 is a diagram showing that a panel driving device supplies a second signal to data lines.

FIG. 9 is a diagram showing that a panel driving device supplies a second signal to a data line.

Referring to FIG. 9, the second circuit 220 supplying a second signal VADJ is connected to a data line DL disposed on the panel 110 and can supply the second signal VADJ to the data line DL.

In this case, a first signal VSEN is supplied to the sensor electrodes S11~S15, S21~S25, and S31~S35 and a second signal VADJ having substantially the same waveform or fluctuating at substantially the same level as the first signal VSEN is supplied to the data line DL. Accordingly, the parasitic capacitance between the sensor electrodes S11~S15, S21~S25, and S31~S35 and the data line DL is substantially removed.

Meanwhile, a plurality of data lines may correspond to one sensor electrode. For example, when seen from above, one sensor electrode and a plurality of data lines may overlap each other. The data lines overlapping when seen from above may generate large parasitic capacitance with respect to the sensor electrodes, as compared with the non-overlapping data lines.

The second circuit can supply the second signal VADJ to the data lines overlapping a first sensor electrode to which the first signal VSEN is supplied, in order to remove the parasitic capacitance.

Depending on embodiments, the panel driving device may supply a capacitance removal signal synchronized in phase with the first signal VSEN, for example a second signal VADJ or a third signal VBUF even to the data line not overlapping the first sensor electrode.

When the panel driving device sends the capacitance removal signal to a greater number of data lines, the parasitic capacitance around sensor electrodes is decreased. However, power consumption is correspondingly increased.

In order to optimally perform trade-off between capacitance removal and power consumption, the panel driving device may divide a plurality of data lines respectively corresponding to sensor electrodes into a plurality of data line groups and supply different signals to the data line groups.

Figure 10:
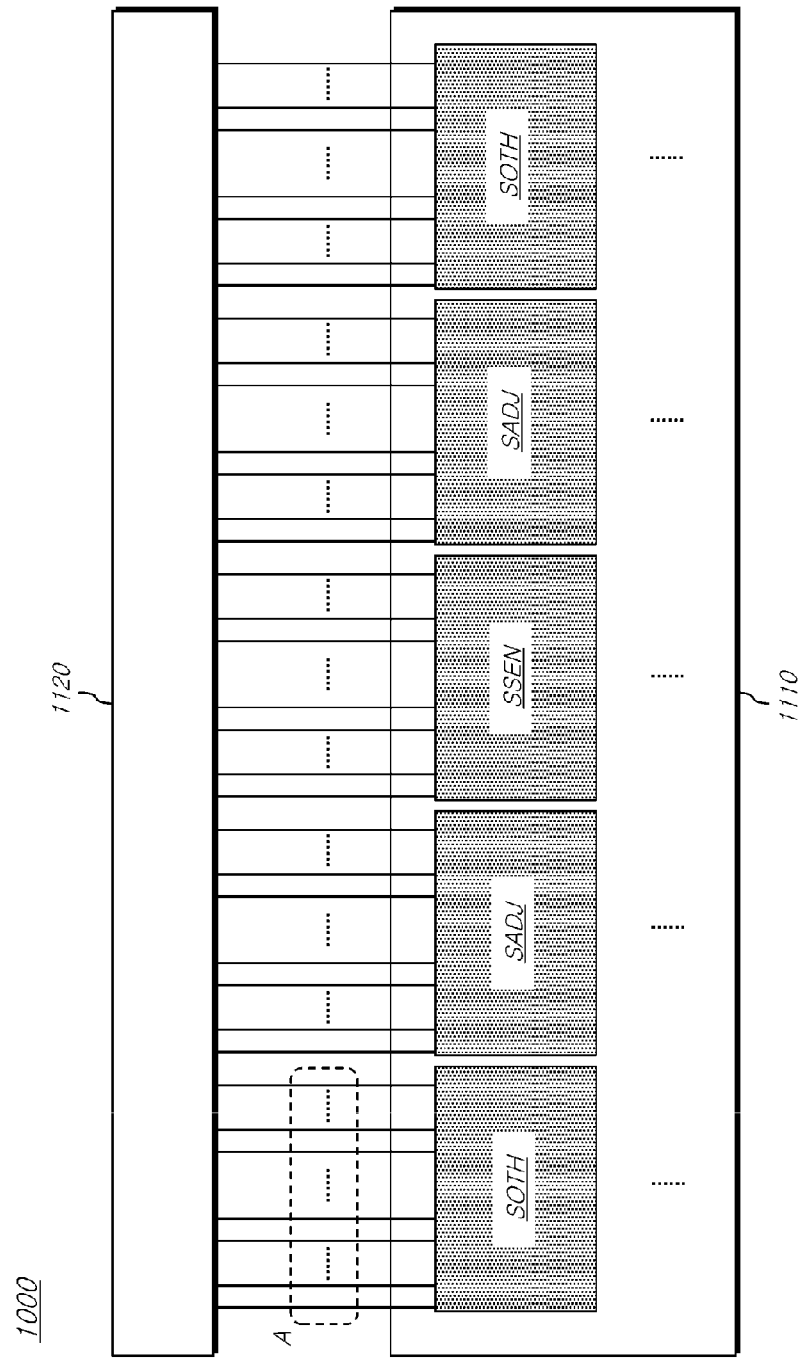
FIG. 10 is a diagram schematically showing the configuration of a display device according to another embodiment.
Figure 11:
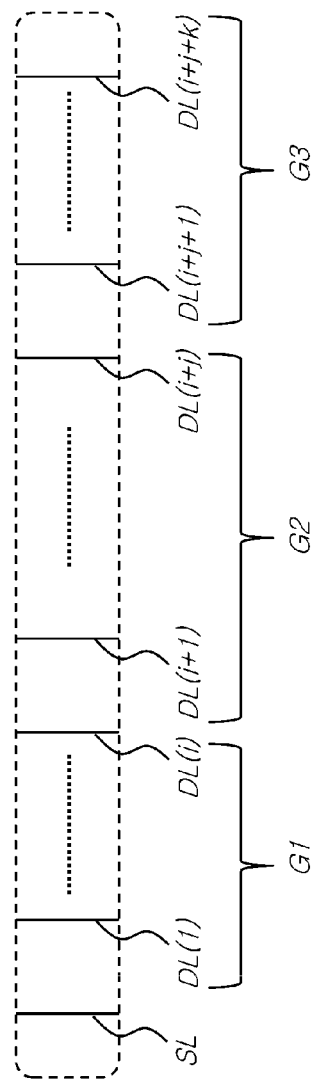
FIG. 11 is an enlarged view showing the portion A of FIG. 10.

FIG. 10 is a diagram schematically showing the configuration of a display device according to another embodiment and FIG. 11 is an enlarged view showing the portion A of FIG. 10. Referring to FIGS. 10 and 11, a display device 1000 may include a panel 1110 and a panel driving device 1120.

A plurality of pixels and a plurality of sensor electrodes SOTH, SADJ, and SSEN are disposed on the panel 1110.

The areas of the sensor electrodes SOTH, SADJ, and SSEN are larger than the areas of the pixels and a plurality of pixels may correspond to each of the sensor electrodes SOTH, SADJ, and SSEN. A plurality of pixels may overlap each of the sensor electrodes SOTH, SADJ, and SSEN on the front side of the panel 1100 when seen from above.

A plurality of data lines DL for transmitting a data voltage to the pixels and a plurality of sensing lines SL for transmitting a touch driving signal to the sensor electrodes SOTH, SADJ, and SSEN may be disposed on the panel 1110.

A plurality of data lines DL(1)~DL(i+j+k) may overlap each of the sensor electrodes SOTH, SADJ, and SSEN. The data lines DL(1)~DL(i+j+k) overlapping each of the sensor electrodes SOTH, SADJ, and SSEN can be divided into a plurality of data line groups G1, G2, and G3. Further, the data line groups G1, G2, and G3 may overlap each of the sensor electrodes SOTH, SADJ, and SSEN.

The panel driving device 1120 can supply a touch driving signal to a first sensor electrode SSEN and a capacitance removal signal to a second sensor electrode SADJ and a third sensor electrode SOTH disposed around the first sensor electrode SSEN.

The panel driving device 1120 can supply capacitance removal signals to the data lines DL, and in this case, the panel driving device can supply different signals to the data line groups.

Figure 12:
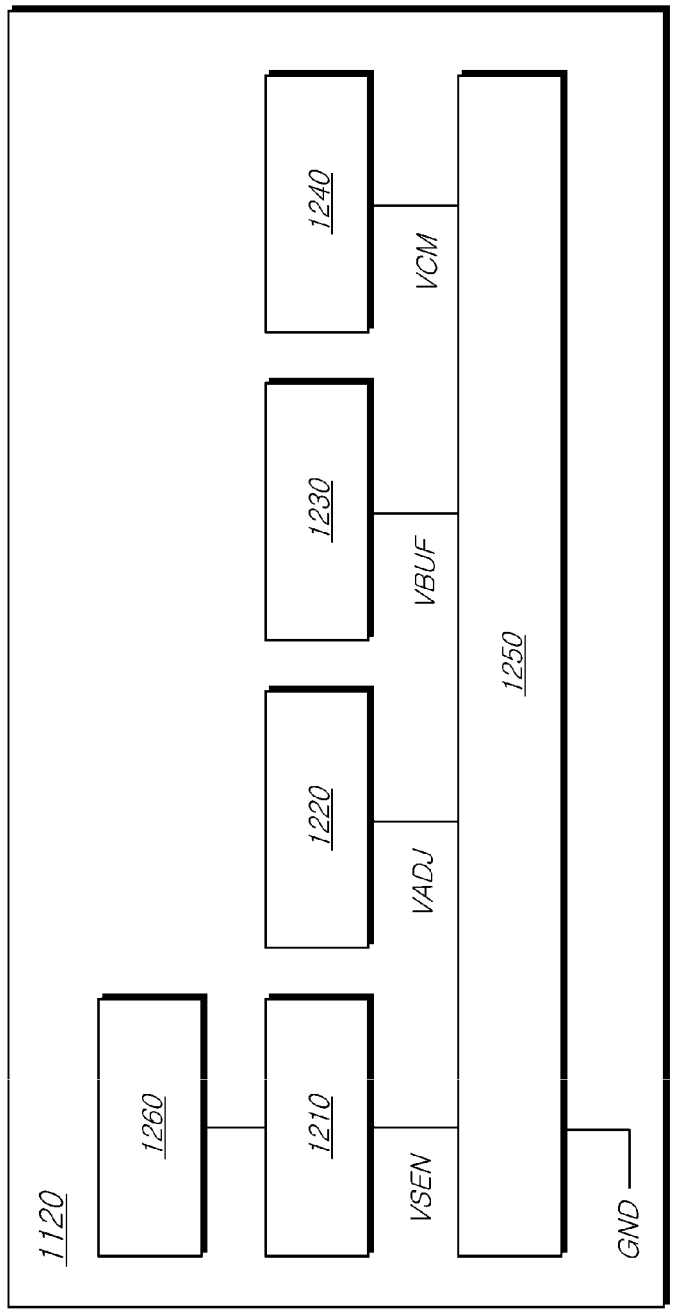
FIG. 12 is a diagram schematically showing an exemplary configuration of the panel driving device according to another embodiment.

FIG. 12 is a diagram schematically showing an exemplary configuration of the panel driving device according to another embodiment.

Referring to FIG. 12, a panel driving device 1120 may include a first circuit 1210, a second circuit 1220, a third circuit 1230, a fourth circuit 1240, a switching circuit 1250, and a sensing circuit 1260.

The first circuit 1210 can supply a first signal VSEN corresponding to a touch driving signal to a first sensor electrode. The first circuit 1210 can generate the first signal VSEN, using a first amplifier that is driven by first-level and second-level voltages. The first signal VSEN can fluctuate to a third level and a fourth level, in which the third level and the fourth level are voltages between the first level and the second level.

The second circuit 1220 can supply a second signal VADJ having substantially the same waveform-magnitude and waveform synchronized in phase as the first signal VSEN. The second circuit 1220 can generate the second signal VADJ, using a second amplifier that is driven by first-level and second-level voltages. The second signal VADJ can fluctuate to the third level and the fourth level, in which the third level and the fourth level are voltages between the first level and the second level.

The third circuit 1230 can supply a third signal VBUF fluctuating to the first level and the second level and synchronized in phase with the first signal VSEN.

The fourth circuit 1240 can supply a common voltage VCM.

The first signal VSEN, second signal VADJ, third signal VBUF, and common voltage VCM can be supplied to sensor electrodes or data lines through the switching circuit 1250.

The switching circuit 1250 can selectively supply one of the first signal VSEN, second signal VADJ, third signal VBUF, and common voltage VCM to the sensor electrodes or the data lines. The switching circuit 1250 may selectively supply a signal other than the first signal VSEN, second signal VADJ, third signal VBUF, and common voltage VCM to the sensor electrodes or the data lines. For example, the switching circuit 1250 can select and supply a ground voltage GND to the data lines.

The sensing circuit 1260 can sense an external object approaching or touching the panel on the basis of a change in the capacitance of the first sensor electrode.

The panel driving device 1120 can supply capacitance removal signals to data lines DL, and in this case, the panel driving device can supply different signals to the data line groups.

FIGS. 13 to 17 are diagrams showing examples of signals that are supplied to sensor electrodes and data lines.

Figure 13:
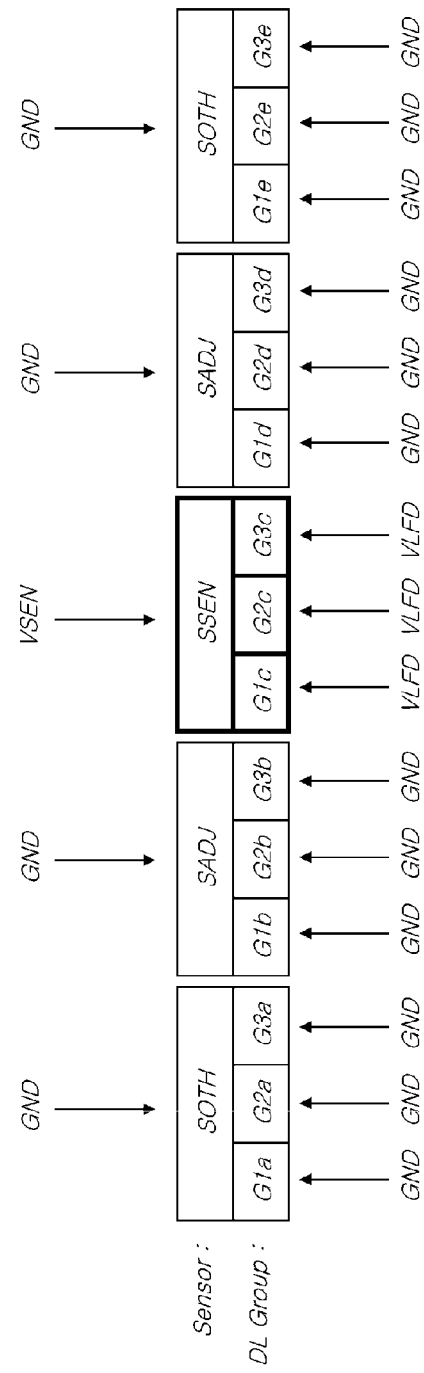
FIG. 13 is a diagram showing a first example of signals that are supplied to sensor electrodes and data lines.

FIG. 13 is a diagram showing a first example of signals that are supplied to sensor electrodes and data lines.

Referring to FIG. 13, a panel driving device, for example, a first circuit can supply a first signal VSEN to a first sensor electrode SSEN.

The panel driving device can supply a capacitance removal signal VLFD to a plurality of data line groups G1c, G2c, and G3c overlapping the first sensor electrode SSEN. When the panel driving device supplies a second signal VADJ to the data line groups G1c, G2c, and G3c overlapping the first sensor electrode SSEN, a second circuit can supply a second signal VADJ to the data line groups G1c, G2c, and G3c overlapping the first sensor electrode SSEN.

The panel driving device can supply a ground voltage GND to other sensor electrodes SADJ and SOTH. The panel driving device can supply the ground voltage GND to data line groups G1a, G2a, G3a, G1b, G2b, G3b, G1d, G2d, G3d, G1e, G2e, and G3e overlapping the sensor electrodes SADJ and SOTH.

Figure 14:
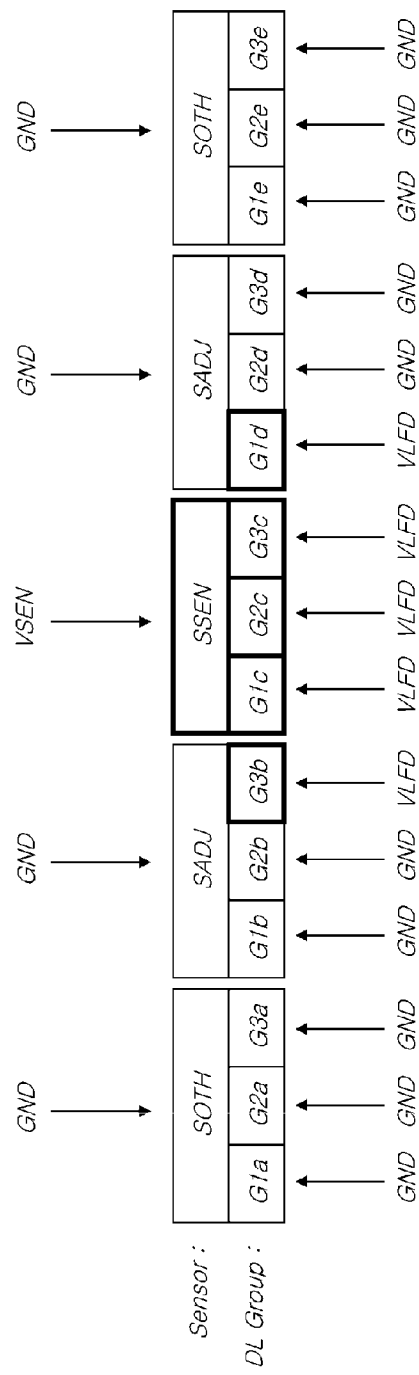
FIG. 14 is a diagram showing a second example of signals that are supplied to sensor electrodes and data lines.

FIG. 14 is a diagram showing a second example of signals that are supplied to sensor electrodes and data lines.

Referring to FIG. 14, a panel driving device, for example, a first circuit can supply a first signal VSEN to a first sensor electrode SSEN.

The panel driving device can supply a capacitance removal signal VLFD to a plurality of data line groups G1c, G2c, and G3c overlapping the first sensor electrode SSEN. When the panel driving device supplies a second signal VADJ to the data line groups G1c, G2c, and G3c overlapping the first sensor electrode SSEN, a second circuit can supply a second signal VADJ to the data line groups G1c, G2c, and G3c overlapping the first sensor electrode SSEN.

The panel driving device can supply a capacitance removal signal VLFD to data line groups G3b and G1d adjacent to the first sensor electrode SSEN. When the panel driving device supplies a second signal VADJ to the data line groups G3b and G1d adjacent to the first sensor electrode SSEN, the second circuit can supply a second signal VADJ to the data line groups G3b and G1d adjacent to the first sensor electrode SSEN.

The panel driving device can supply a ground voltage GND to other sensor electrodes SADJ and SOTH. The panel driving device can supply the ground voltage GND to data line groups G1a, G2a, G3a, G1b, G2b, G2d, G3d, G1e, G2e, and G3e to which the capacitance removal signal VLFD is not supplied.

In the example shown in FIG. 14, the panel driving device supplies different signals to a plurality of data line groups overlapping a second sensor electrode SADJ adjacent to the first sensor electrode SSEN. In detail, the panel driving device supplies the capacitance removal signal VLFD to the data line groups G3b and G1d adjacent to the first sensor electrode SSEN of the data line groups G1b, G2b, G3b, G1d, G2d, and G3d overlapping the second sensor electrode SADJ and supplies the ground voltage to the data line groups G1b, G2b, G2d, and G3d not adjacent to the first sensor electrode SSEN. Considering that parasitic capacitance is increased as approaching the first sensor electrode SSEN, the panel driving device, through this driving, can achieve an effect of minimizing influence on the first sensor electrode SSEN by the parasitic capacitance and reducing power consumption.

Figure 15:
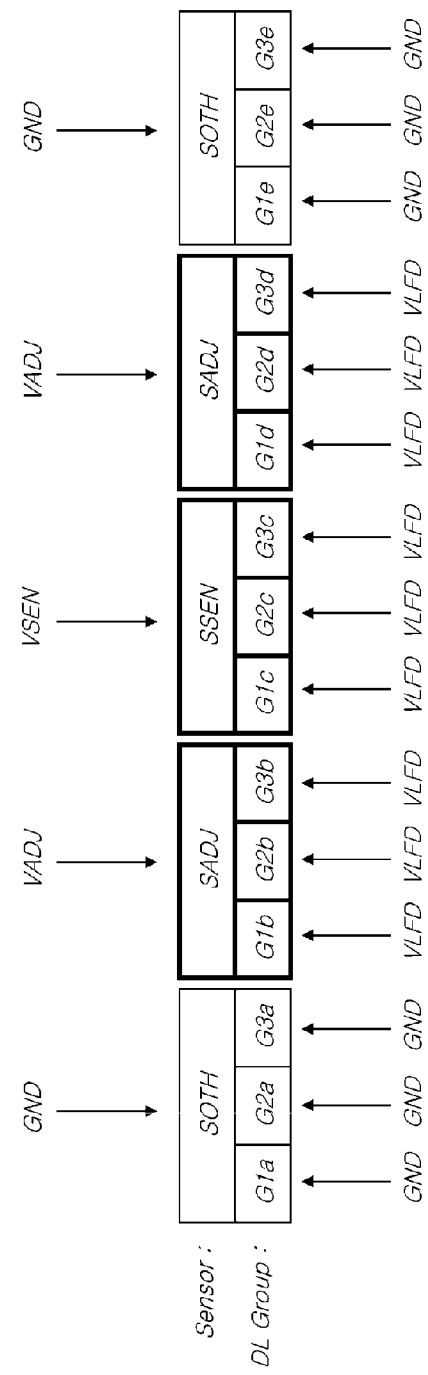
FIG. 15 is a diagram showing a third example of signals that are supplied to sensor electrodes and data lines.

FIG. 15 is a diagram showing a third example of signals that are supplied to sensor electrodes and data lines.

Referring to FIG. 15, a panel driving device, for example, a first circuit can supply a first signal VSEN to a first sensor electrode SSEN.

The panel driving device can supply a capacitance removal signal VLFD to a plurality of data line groups G1c, G2c, and G3c overlapping the first sensor electrode SSEN. When the panel driving device supplies a second signal VADJ to the data line groups G1c, G2c, and G3c overlapping the first sensor electrode SSEN, a second circuit can supply a second signal VADJ to the data line groups G1c, G2c, and G3c overlapping the first sensor electrode SSEN.

The panel driving device, for example, the second circuit can supply the second signal VADJ to a second sensor electrode SADJ adjacent to the first sensor electrode SSEN. The panel driving device can supply a parasitic removal signal VLFD to data line groups G1b, G2b, G3b, G1d, G2d, and G3d overlapping the second sensor electrode SADJ.

The panel driving device can supply a ground voltage GND to a third sensor electrode SOTH not adjacent to the first sensor electrode SSEN and can supply a ground voltage GND to data line groups G1a, G2a, G3a, G1e, G2e, and G3e overlapping the third sensor electrode SOTH.

Figure 16:
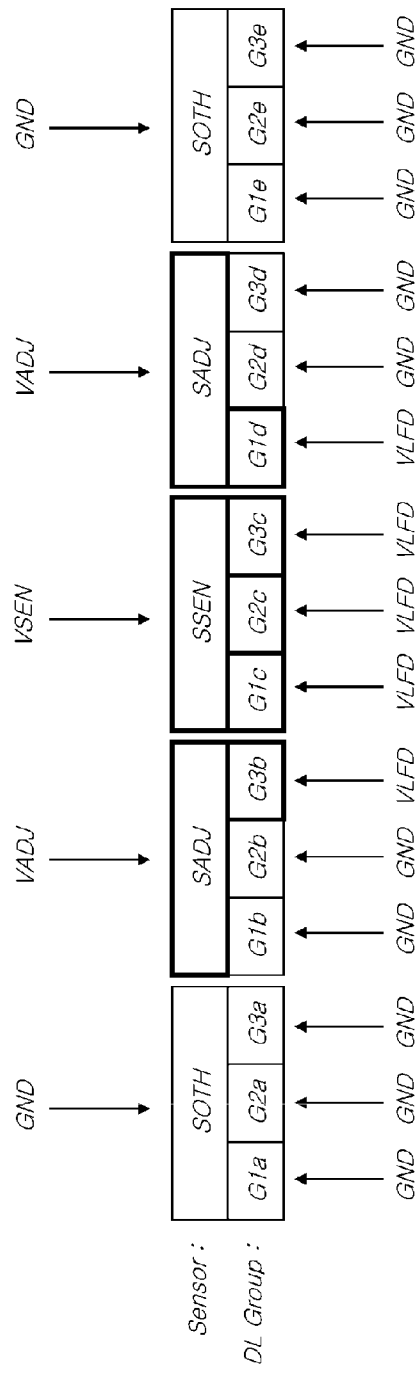
FIG. 16 is a diagram showing a fourth example of signals that are supplied to sensor electrodes and data lines.

FIG. 16 is a diagram showing a fourth example of signals that are supplied to sensor electrodes and data lines.

Referring to FIG. 16, a panel driving device, for example, a first circuit can supply a first signal VSEN to a first sensor electrode SSEN.

The panel driving device can supply a capacitance removal signal VLFD to a plurality of data line groups G1c, G2c, and G3c overlapping the first sensor electrode SSEN. When the panel driving device supplies a second signal VADJ to the data line groups G1c, G2c, and G3c overlapping the first sensor electrode SSEN, a second circuit can supply a second signal VADJ to the data line groups G1c, G2c, and G3c overlapping the first sensor electrode SSEN.

The panel driving device can supply a capacitance removal signal VLFD to data line groups G3b and G1d adjacent to the first sensor electrode SSEN. When the panel driving device supplies a second signal VADJ to the data line groups G3b and G1d adjacent to the first sensor electrode SSEN, the second circuit can supply a second signal VADJ to the data line groups G3b and G1d adjacent to the first sensor electrode SSEN.

The panel driving device, for example, the second circuit can supply the second signal VADJ to a second sensor electrode SADJ adjacent to the first sensor electrode SSEN. The panel driving device can supply a ground voltage GND to data line groups G1b, G2b, G2d, and G3d not adjacent to the first sensor electrode SSEN in data lines overlapping the second sensor electrode SADJ.

The panel driving device can supply a ground voltage GND to a third sensor electrode SOTH not adjacent to the first sensor electrode SSEN and can supply a ground voltage GND to data line groups G1a, G2a, G3a, G1e, G2e, and G3e overlapping the third sensor electrode SOTH.

Figure 17:
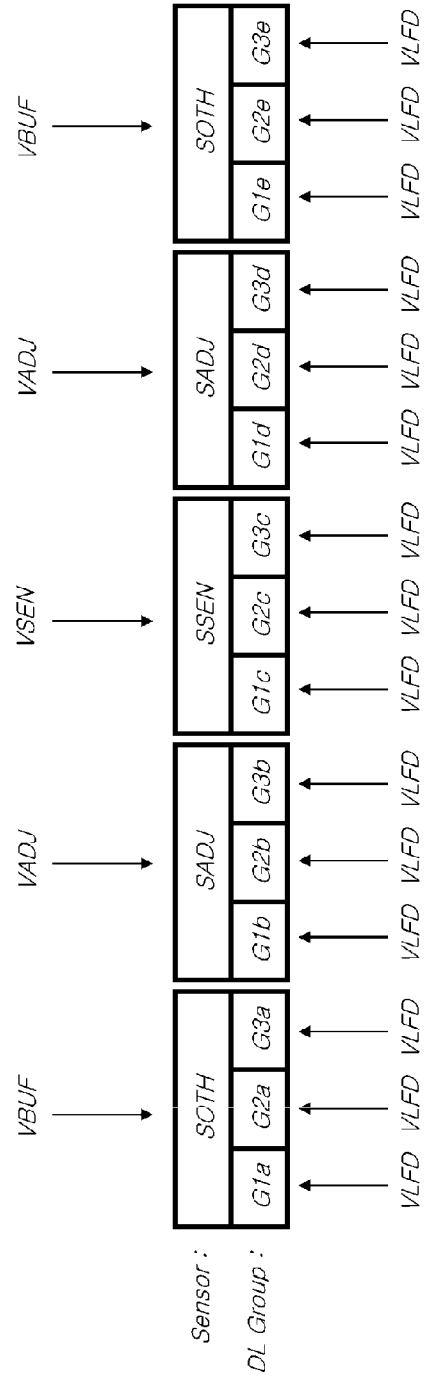
FIG. 17 is a diagram showing a fifth example of signals that are supplied to sensor electrodes and data lines.

FIG. 17 is a diagram showing a fifth example of signals that are supplied to sensor electrodes and data lines.

Referring to FIG. 17, a panel driving device, for example, a first circuit can supply a first signal VSEN to a first sensor electrode SSEN.

The panel driving device can supply a capacitance removal signal VLFD to a plurality of data line groups G1c, G2c, and G3c overlapping the first sensor electrode. When the panel driving device supplies a second signal VADJ to the data line groups G1c, G2c, and G3c overlapping the first sensor electrode SSEN, a second circuit can supply a second signal VADJ to the data line groups G1c, G2c, and G3c overlapping the first sensor electrode SSEN.

The panel driving device, for example, the second circuit can supply the second signal VADJ to a second sensor electrode SADJ adjacent to the first sensor electrode SSEN. The panel driving device can supply a parasitic removal signal VLFD to data line groups G1b, G2b, G3b, G1d, G2d, and G3d overlapping the second sensor electrode SADJ.

The panel driving device can supply a third signal VBUF to a third sensor electrode SOTH not adjacent to the first sensor electrode SSEN and can supply a capacitance removal signal VLFD to data line groups G1a, G2a, G3a, G1e, G2e, and G3e overlapping the third sensor electrode SOTH.

On the other hand, a plurality of sensor electrodes may be disposed in columns and rows on a panel and the sensor electrodes can be sequentially driven in each column or row. When many sensor electrodes are disposed in the columns or rows, a panel driving device can divide the columns or rows into two sections and can simultaneously drive the first section and the second section.

Figure 18:
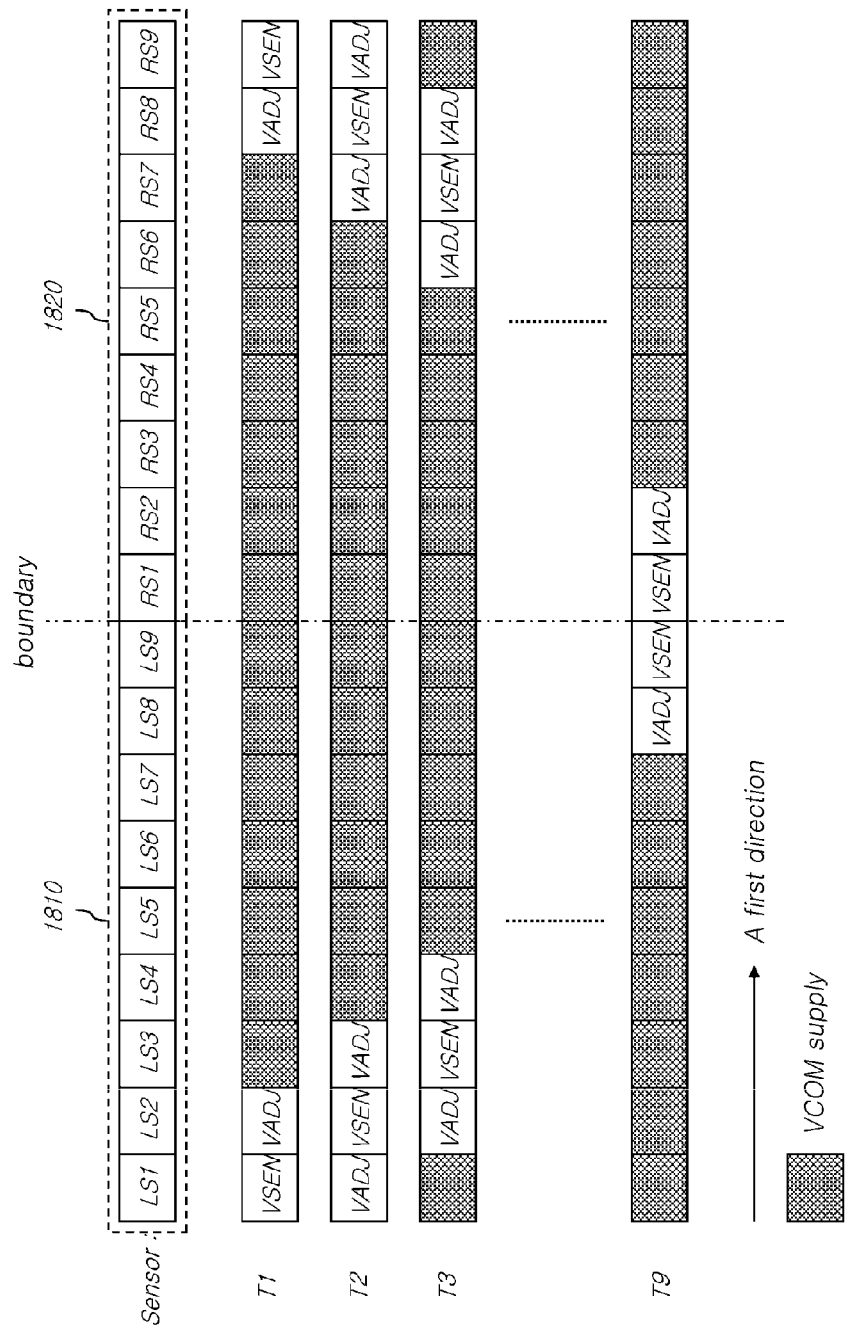
FIG. 18 is a diagram showing a first example of sequentially driving sensor electrodes.
Figure 19:
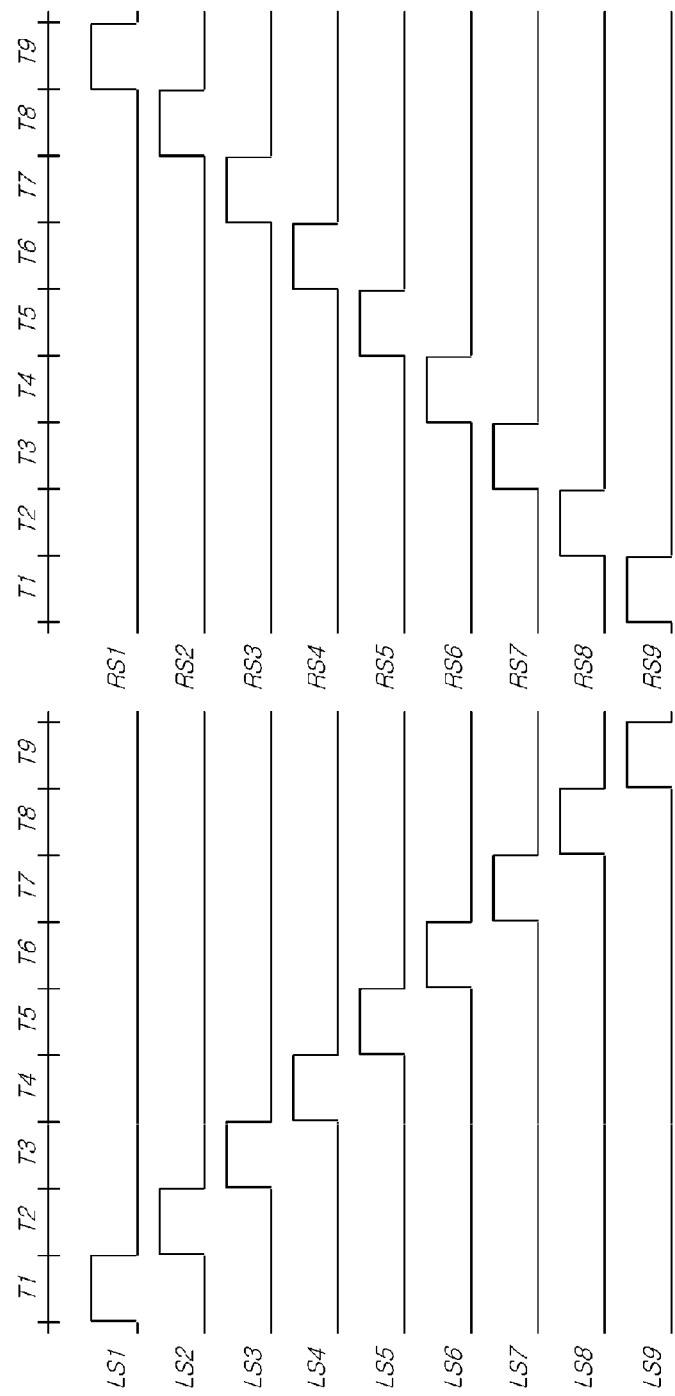
FIG. 19 is a timing diagram of a first signal that is supplied to the sensor electrodes in the example of FIG. 18.
Figure 20:
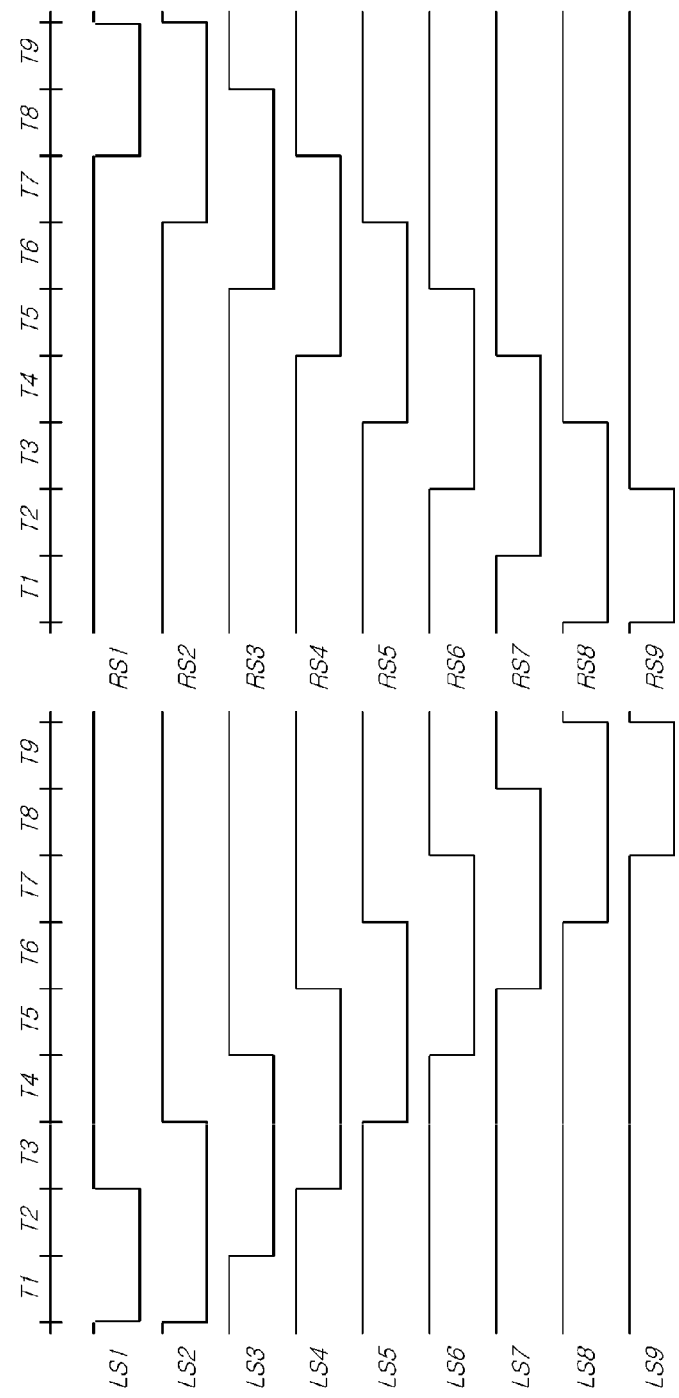
FIG. 20 is a timing diagram of a common voltage that is supplied to the sensor electrodes in the example of FIG. 18.

FIG. 18 is a diagram showing a first example of sequentially driving sensor electrodes, FIG. 19 is a timing diagram of a first signal that is supplied to the sensor electrodes in the example of FIG. 18, and FIG. 20 is a timing diagram of a common voltage that is supplied to the sensor electrodes in the example of FIG. 18.

Referring to FIG. 18, sensor electrodes disposed on a panel can be divided into a first section 1810 and a second section 1820 in accordance with columns or rows.

Referring to FIGS. 18 and 19, a panel driving device, for example, a first circuit can supply a first signal VSEN to sensor electrodes LS1~LS9 disposed in the first section 1810 while sequentially selecting the sensor electrodes in a first direction.

Further, the panel driving device, for example, can supply the first signal VSEN to sensor electrodes RS1~RS9 disposed in the second section 1820 while sequentially selecting the sensor electrodes in an opposite direction to the first direction.

The panel driving device, for example, a second circuit can supply a second signal VADJ to sensor electrodes adjacent to the sensor electrodes to which the first signal VSEN is supplied.

In this driving method, it is problematic to drive the sensor electrodes LS9 and RS1 disposed at the boundary between the first section 1810 and the second section 1820.

In the example shown in FIG. 18, since the panel driving device supplies the first signal VSEN in different directions for the first section 1810 and the second section 1820, the sensor electrodes LS9 and RS1 at the boundary are simultaneously supplied with the first signal VSEN. In this driving, the first signal VSEN and the second signal VADJ have substantially the same waveform, so an effect like that of supplying a capacitance removal signal to adjacent sensor electrodes is applied to the sensor electrodes LS9 and RS1 at the boundary.

On the other hand, when a sensor electrode is not used for touch driving, the sensor electrode may be used as a common electrode to which a common voltage is supplied. When a common voltage is supplied to a sensor electrode, pixels overlapping the sensor electrode can be driven for displaying.

Referring to FIGS. 18, 19, and 20, a panel driving device does not supply a common voltage VCOM in a period in which a first signal VSEN is supplied to the sensor electrodes. Further, the panel driving device does not supply a common voltage VCOM even in a period in which a second signal VADJ is not supplied. The panel driving device can supply a common voltage VCOM to the sensor electrodes in a period in which the first signal VSEN or a capacitance removal signal is not supplied.

Figure 21:
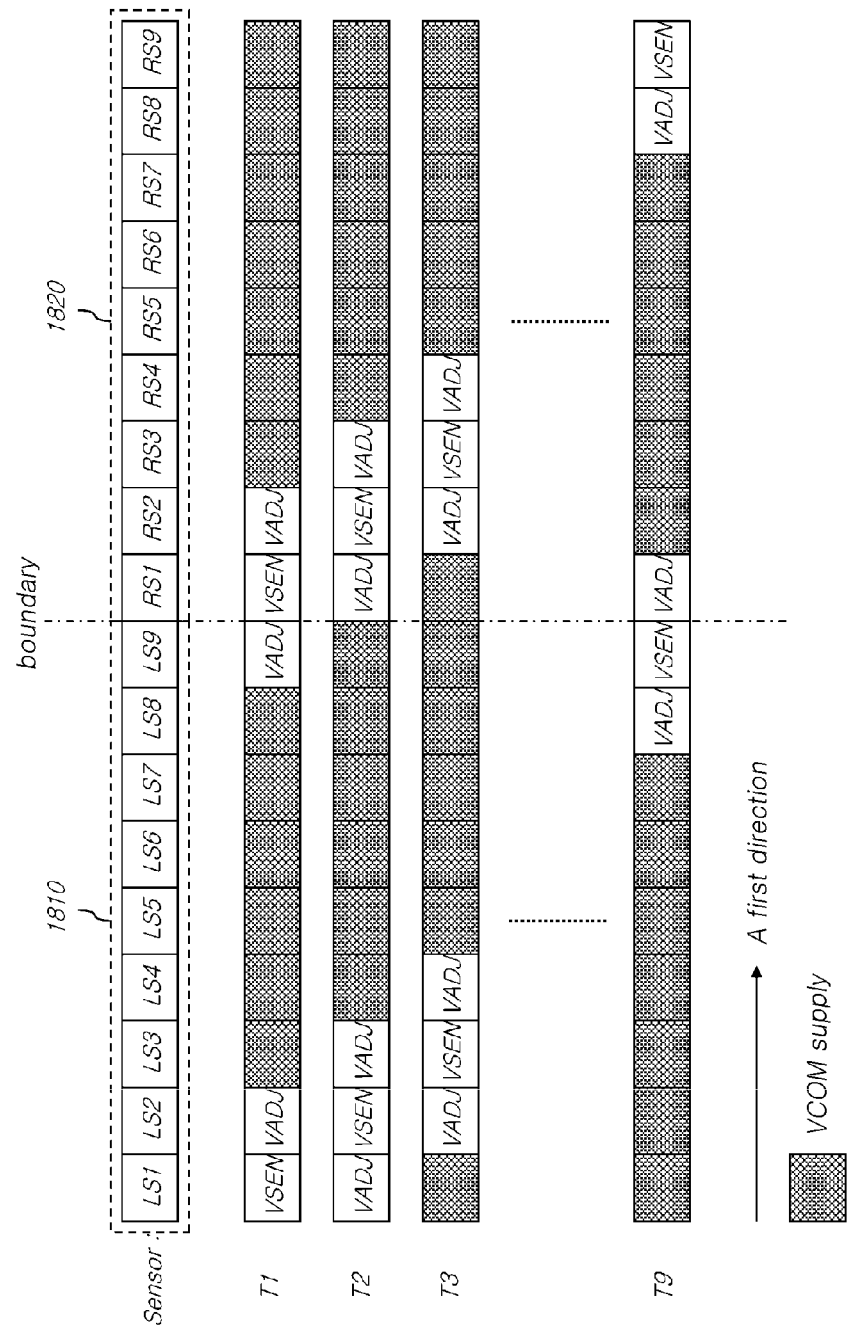
FIG. 21 is a diagram showing a second example of sequentially driving sensor electrodes.
Figure 22:
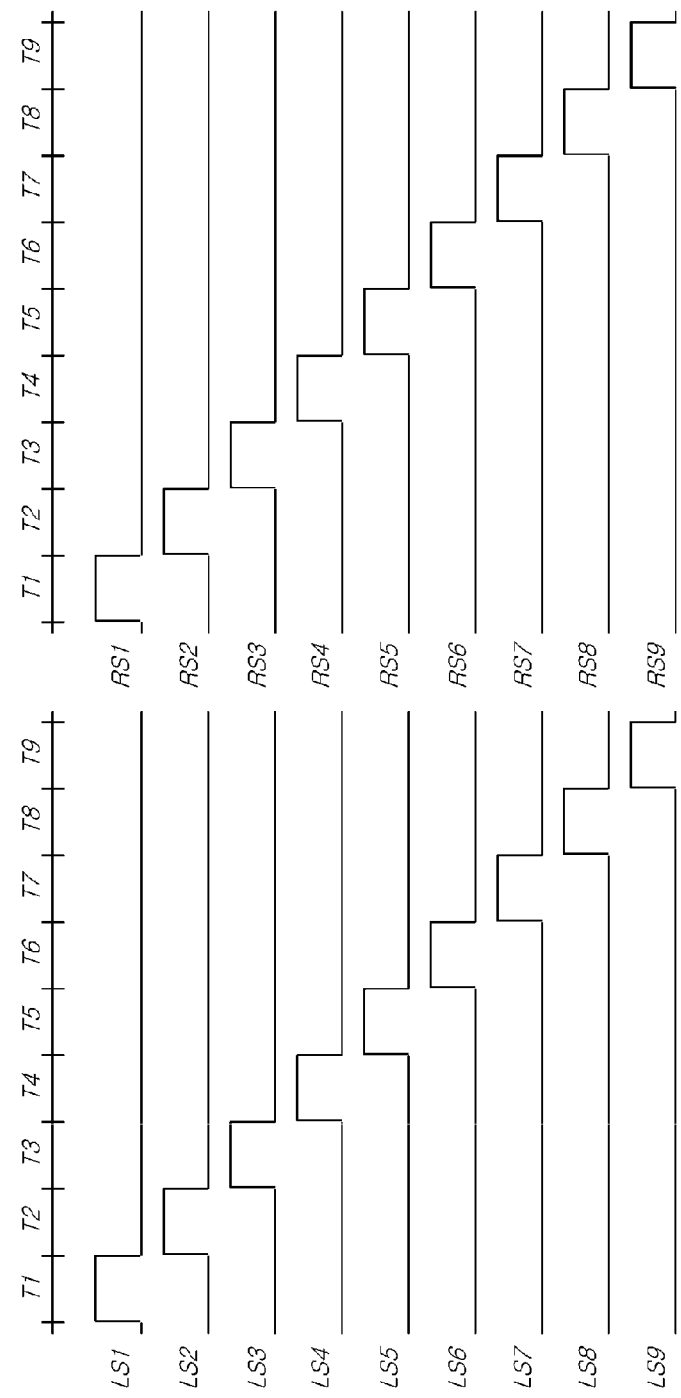
FIG. 22 is a timing diagram of a first signal that is supplied to the sensor electrodes in the example of FIG. 21.
Figure 23:
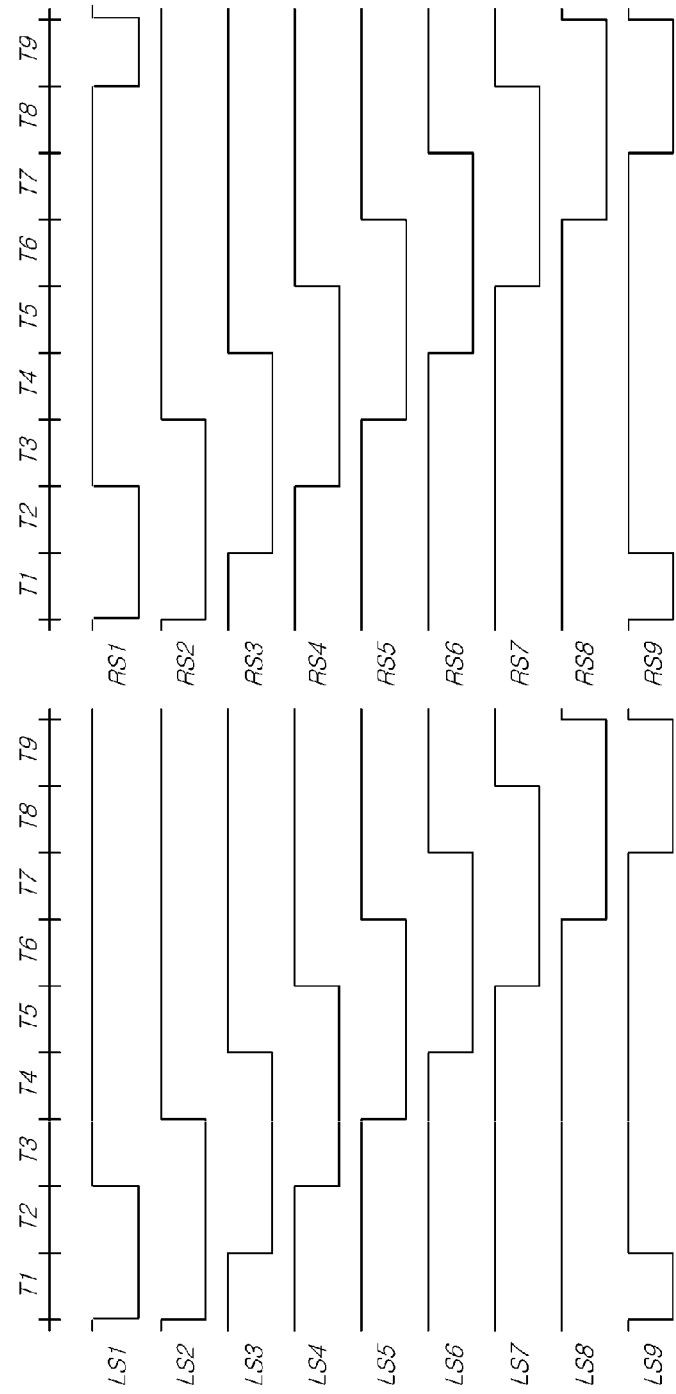
FIG. 23 is a timing diagram of a common voltage that is supplied to the sensor electrodes in the example of FIG. 21.

FIG. 21 is a diagram showing a second example of sequentially driving sensor electrodes, FIG. 22 is a timing diagram of a first signal that is supplied to the sensor electrodes in the example of FIG. 21, and FIG. 23 is a timing diagram of a common voltage that is supplied to the sensor electrodes in the example of FIG. 21.

Referring to FIG. 21, sensor electrodes disposed on a panel can be divided into a first section 1810 and a second section 1820 in accordance with columns or rows.

Referring to FIGS. 21 and 22, a panel driving device, for example, a first circuit can supply a first signal VSEN to sensor electrodes LS1~LS9 disposed in the first section 1810 while sequentially selecting the sensor electrodes in a first direction.

Further, the panel driving device, for example, can supply the first signal VSEN to sensor electrodes RS1~RS9 disposed in the second section 1820 while sequentially selecting the sensor electrodes in the same direction as the first direction.

The panel driving device, for example, a second circuit can supply a second signal VADJ to sensor electrodes adjacent to the sensor electrodes to which the first signal VSEN is supplied.

In this driving method, it is problematic to drive the sensor electrodes LS9 and RS1 disposed at the boundary between the first section 1810 and the second section 1820.

In the example shown in FIG. 21, since the panel driving device supplies the first signal VSEN in the same direction for the first section 1810 and the second section 1820, it is unavoidable to supply a capacitance removal signal to sensor electrodes in other sections in order to supply a capacitance removal signal to the surrounding of the sensor electrodes LS9 and RS1 disposed at the boundary.

For this configuration, the panel driving device, for example, a second circuit supplies a second signal VADJ to sensor electrodes adjacent to the sensor electrodes to which the first signal VSEN is supplied. Further, the panel driving device supplies the second signal VADJ to the sensor electrode LS9 disposed in the first section 1810 and adjacent to the boundary with the second section 1820, when the first signal VSEN is supplied to the sensor electrode RS1 disposed in the second section 1820 and adjacent to the boundary with the first section 1810. Further, the panel driving device supplies a second signal VADJ to the sensor electrode RS1 disposed in the second section 1820 and adjacent to the boundary with the first section 1810, when the first signal VSEN is supplied to the sensor electrode LS9 disposed in the first section 1810 and adjacent to the boundary with the second section 1820.

On the other hand, when a sensor electrode is not used for touch driving, the sensor electrode may be used as a common electrode to which a common voltage is supplied. When a common voltage is supplied to a sensor electrode, pixels overlapping the sensor electrode can be driven for displaying.

Referring to FIGS. 21, 22, and 23, a panel driving device does not supply a common voltage VCOM in a period in which a first signal VSEN is supplied to the sensor electrodes. Further, the panel driving device does not supply a common voltage VCOM even in a period in which a second signal VADJ is not supplied. The panel driving device can supply a common voltage VCOM to the sensor electrodes in a period in which the first signal VSEN or a capacitance removal signal is not supplied.

An embodiment of removing parasitic capacitance that is generated between sensor electrodes or parasitic capacitance that is generated between a sensor electrode and another electrode was described above. According to the embodiment, the parasitic capacitance that is generated between sensor electrodes or the parasitic capacitance that is generated between a sensor electrode and another is recognized as being small or not recognized. Accordingly, touch sensitivity is increased and power consumption for touch driving is reduced.

Further, the terms "comprise", "include", "have", etc. when used in this specification mean that the components can exist unless specifically stated otherwise, so they should be construed as being able to further include other components. Unless otherwise defined, all terms including technical and scientific terms used herein have the same meaning as commonly understood by those skilled in the art to which the present disclosure belongs. It will be further understood that terms commonly used, such as those defined in dictionaries, should be interpreted as having a meaning that is consistent with their meaning in the context of the relevant art and the present disclosure, and will not be interpreted in an idealized or overly formal sense unless expressly so defined herein.

The above description merely explains the spirit of the present disclosure and the present disclosure may be changed and modified in various ways without departing from the spirit of the present disclosure by those skilled in the art. Accordingly, the embodiments described herein are provided merely not limit, but explain the spirit of the present disclosure, and the spirit of the present disclosure is not limited by the embodiments. The protective range of the present disclosure should be construed by the following claims and all scopes and spirits in the equivalent range to the protective range should be construed as being included in the patent right of the present disclosure.

CROSS-REFERENCE TO RELATED APPLICATION

The present application claims priority to Korean Patent Application No. 10-2015-0120201, filed on Aug. 26, 2015 under U.S. Patent Law 119(a) (35 U.S.C. § 119(a), the entire contents of which is incorporated herein for all purposes by this reference.

In addition, this non-provisional application claims priorities in countries, other than the U.S., with the same reason based on the Korean Patent Applications, the entire contents of which are hereby incorporated by reference.

The invention claimed is:

1. A device for driving a panel comprising a plurality of sensor electrodes, the device comprising:
 a first circuit configured to supply a first signal to a first sensor electrode, using a first amplifier configured to be driven by first-level and second-level voltages;
 a second circuit configured to supply a second signal synchronized in size and phase with the first signal to a second sensor electrode adjacent to the first sensor electrode, using a second amplifier configured to be driven by the first-level and second-level voltages;
 a third circuit configured to supply a third signal fluctuating to the first level and the second level and synchronized in phase with the first signal to a third sensor electrode; and
 a sensing circuit configured to sense an external object approaching or touching the panel on the basis of a change in capacitance of the first sensor electrode,
 wherein a plurality of data lines transmitting a data voltage to pixels is disposed on the panel, and the second circuit supplies the second signal to a first data line of the plurality of data lines, the first data line overlapping the first sensor electrode when seen from above,
 wherein a ground voltage or the third signal is supplied to a second data line from the plurality of data lines, to which the second signal is not supplied.

2. The device of claim 1, wherein the first signal and the second signal fluctuate to a third level and a fourth level, and the third level and the fourth level are levels between the first level and the second level.

3. The device of claim 1, wherein the third sensor electrode generates parasitic capacitance between the first sensor electrode and the third sensor electrode, and is not adjacent to the first sensor electrode.

4. The device of claim 1, further comprising a plurality of switching circuits configured to selectively output one of the first signal, the second signal, and the third signal or another signal to the sensor electrodes.

5. The device of claim 1, further comprising a fourth circuit configured to supply a common voltage to the sensor electrodes,
 wherein the first circuit supplies the first signal to the first sensor electrode in a first time period, and
 the fourth circuit supplies a common voltage to the first sensor electrode in a second time period not overlapping the first time period.

6. The device of claim 1, further comprising a third amplifier configured to be driven by a first power voltage and output the second-level voltage to the first amplifier and the second amplifier,
 wherein the first amplifier, the second amplifier, and the third amplifier share a ground voltage corresponding to the first level.

7. The device of claim 1, wherein the third circuit generates the third signal by selectively outputting the first-level voltage and the second-level voltage.

8. The device of claim 1, wherein the first circuit supplies the first signal to a sensing group composed of two or more sensor electrodes, and
 the second circuit supplies the second signal to surrounding groups disposed adjacent to the sensing group and composed of two or more sensor electrodes.

9. A method of driving a panel driving device comprising a plurality of sensor electrodes, the method comprising:
 supplying a first signal having a first waveform to a first sensor electrode, using a first amplifier configured to be driven by first-level and second-level voltages;
 supplying a second signal having substantially the same waveform as the first waveform to a second sensor electrode adjacent to the first sensor electrode, using a second amplifier configured to be driven by the first-level and second-level voltages;
 supplying a third signal fluctuating to the first level and the second level and synchronized in phase with the first signal to a third sensor electrode; and
 sensing an external object approaching or touching the panel on the basis of a change in capacitance of the first sensor electrode,
 wherein a plurality of data lines transmitting a data voltage to pixels is disposed on the panel, and the second signal is supplied to a first data line from the plurality of data lines, the first data line overlapping the first sensor electrode when seen from above, wherein a ground voltage or the third signal is supplied to a second data line from the plurality of data lines, to which the second signal is not supplied.

10. The method of claim 9, further comprising supplying a common voltage to the sensor electrodes, wherein the first signal is supplied to the first sensor electrode in a first time period, and a common voltage is supplied to the sensor electrodes in a second time period not overlapping the first time period.

11. A device for driving a panel comprising a plurality of pixels, a plurality of data lines transmitting a data voltage to the pixels, and a plurality of sensor electrodes respectively overlapping a plurality of data line groups, the device comprising:

a first circuit configured to supply a first signal to a first sensor electrode;

a second circuit configured to supply a second signal synchronized in phase with the first signal to a plurality of data line groups overlapping the first sensor electrode, and to supply a second signal to at least one of a plurality of data line groups overlapping a second sensor electrode adjacent to the first sensor electrode; and a sensing circuit configured to sense an external object approaching or touching the panel on the basis of a change in capacitance of the first sensor electrode, wherein the second circuit supplies the second signal only to one data line group adjacent to the first sensor electrode of a plurality of data line groups overlapping the second sensor electrode, wherein a ground voltage is supplied to data line groups, to which the second signal is not supplied, of the data line groups overlapping the second sensor electrode.

12. The device of claim 11, wherein the first circuit generates a first signal, using a first amplifier configured to be driven by first-level and second-level voltages, and the second circuit generates the second signal synchronized in size and phase with the first signal, using a second amplifier configured to be driven by the first-level and second-level voltages.

13. The device of claim 11, wherein the second circuit supplies the second signal to the second sensor electrode.

14. The device of claim 13, further comprising a third circuit configured to supply a third signal fluctuating to the first level and the second level and synchronized in phase with the first signal to a third sensor electrode.

15. The device of claim 11, wherein the first circuit supplies the first signal to sensor electrodes disposed in a first section while sequentially selecting the sensor electrodes in a first direction, and supplies the first signal sensor electrodes disposed in a second section while sequentially selecting the sensor electrodes in an opposite direction to the first direction.

16. The device of claim 11, wherein the first circuit supplies the first signal while sequentially selecting sensor electrodes disposed in a first section in a first direction, and supplies the first signal while sequentially selecting sensor electrodes disposed in the second section in the same direction as the first direction.

17. The device of claim 16, wherein the second circuit supplies the second signal to a sensor electrode adjacent to a sensor electrode to which the first signal is supplied, and supplies the second signal to a sensor electrode disposed in the first section and adjacent to a boundary with the second section when the first signal is supplied to a sensor electrode disposed in the second section and adjacent to the boundary with the first section.

* * * * *